(12) United States Patent
Mackie et al.

(10) Patent No.: US 10,446,706 B2
(45) Date of Patent: Oct. 15, 2019

(54) HEXAGONAL PHASE EPITAXIAL CADMIUM SULFIDE ON COPPER INDIUM GALLIUM SELENIDE FOR A PHOTOVOLTAIC JUNCTION

(71) Applicants: BEIJING APOLLO DING RONG SOLAR TECHNOLOGY CO., LTD., Beijing (CN); THE BOARD OF TRUSTEES OF THE UNIVERSITY OF ILLINOIS, Urbana, IL (US)

(72) Inventors: Neil Mackie, Fremont, CA (US); Geordie Zapalac, San Francisco, CA (US); Weijie Zhang, San Jose, CA (US); John F. Corson, Mountain View, CA (US); Xiaoqing He, Champaign, IL (US); Angus Rockett, Champaign, IL (US); Joel Varley, San Francisco, CA (US); Vincenzo Lordi, San Francisco, CA (US)

(73) Assignees: BEIJING APOLLO DING RONG SOLAR TECHNOLOGY CO., LTD., Beijing (CN); LAWRENCE LIVERMORE NATIONAL SECURITY, LLC, Livermore, CA (US); THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 468 days.

(21) Appl. No.: 15/153,478

(22) Filed: May 12, 2016

(65) Prior Publication Data
US 2016/0336475 A1    Nov. 17, 2016

Related U.S. Application Data

(60) Provisional application No. 62/162,371, filed on May 15, 2015.

(51) Int. Cl.
*H01L 31/0749* (2012.01)
*H01L 31/18* (2006.01)
(Continued)

(52) U.S. Cl.
CPC .... *H01L 31/0749* (2013.01); *H01L 21/02485* (2013.01); *H01L 21/02557* (2013.01);
(Continued)

(58) Field of Classification Search
None
See application file for complete search history.

(56) References Cited

U.S. PATENT DOCUMENTS 4,287,383 A * 9/1981 Peterson .......... H01L 31/03365
136/260
4,320,154 A * 3/1982 Biter .............. H01L 31/022425
136/256

(Continued)

FOREIGN PATENT DOCUMENTS

CN  101820028 A  9/2010
CN  102453863 A  5/2012

OTHER PUBLICATIONS

Zhang et al. Crystal Growth & Design, vol. 7, No. 3, 2007, p. 580-586. (Year: 2007).*

(Continued)

*Primary Examiner* — Eli S Mekhlin
(74) *Attorney, Agent, or Firm* — The Marbury Law Group, PLLC

(57) ABSTRACT

A method of manufacturing a photovoltaic structure includes forming a p-type semiconductor absorber layer containing a copper indium gallium selenide based material over a first electrode, forming a n-type cadmium sulfide layer over the p-type semiconductor absorber layer by sputtering in an
(Continued)

ambient including hydrogen gas and oxygen gas, and forming a second electrode over the cadmium sulfide layer.

12 Claims, 16 Drawing Sheets

(51) Int. Cl.
    *H01L 21/02*         (2006.01)
    *H01L 31/0296*    (2006.01)
    *H01L 31/036*     (2006.01)

(52) U.S. Cl.
    CPC .... *H01L 21/02631* (2013.01); *H01L 31/0296* (2013.01); *H01L 31/036* (2013.01); *H01L 31/18* (2013.01); *H01L 31/1828* (2013.01); *Y02E 10/541* (2013.01); *Y02E 10/543* (2013.01); *Y02P 70/521* (2015.11)

(56) References Cited

U.S. PATENT DOCUMENTS

| | | | | |
|---|---|---|---|---|
| 7,943,415 | B1* | 5/2011 | Gossman | C23C 14/0057 438/93 |
| 2007/0257255 | A1* | 11/2007 | Dhere | H01L 31/0322 257/40 |
| 2010/0175749 | A1* | 7/2010 | Tsutsumi | H01L 31/022433 136/256 |
| 2013/0160831 | A1* | 6/2013 | Zubeck | H01L 31/0322 136/256 |

OTHER PUBLICATIONS

Aquino, A. et al., "Chemical reactions at CdS Heterojunctions with CuInSe2," Journal of Vacuum Science & Technology A: Vacuum, Surfaces, and Films, vol. 31, No. 2, pp. 021202-1 to 021202-6, (2013).

Sadtler, B. et al., "Selective Facet Reactivity during Cation Exchange in Cadmium Sulfide Nanorods," J. Am. Chem. Soc. 2009, vol. 131, pp. 5285-5293, (2009).

Gill, W.D. et al., "Photovoltaic Properties of Cu2S—CdS Heterojunctions," Journal of Applied Physics vol. 41, No. 9, pp. 3731-3738, (1970).

Gloskovskii, A. et al., "Hard x-ray photoelectron spectroscopy of chalcopyrite solar cell components," Appl. Phys. Lett. vol. 100, pp. 092108-1 to 092108-3, (2012).

Green, M.A. et al., "Solar cell efficiency tables (version 43)," Prog. Photovolt: Res. Appl. 2014; vol. 22, pp. 1-9, (2014).

Guillen, C. et al., "Accurate control of thin film CdS growth process by adjusting the chemical bath deposition parameters," Thin Solid Films, vol. 335, pp. 37-42, (1998).

He, H.Q. et al., "Microstructural and Chemical Investigation of PVD-CdS/PVD-CuIn1-xGaxSe2 Heterojunctions: A Transmission Electron Microscopy Study," IEEE Journal of Photovoltaics, vol. 4, No. 6, pp. 1625-1629, (2014).

Khallaf, H. et al., "Characterization of CdS thin films grown by chemical bath deposition using four different cadmium sources," Thin Solid Films, vol. 516, pp. 7306-7312, (2008).

Liao, D. et al., "Cd doping at the CuInSe2/CdS heterojunction," Journal of Applied Physics, vol. 93, No. 11, pp. 9380-9382, (2003).

Liao, D. et al., "Cu depletion at the CuInSe2 surface," Applied Physics Letters, vol. 82, No. 17, pp. 2829-2831, (2003).

Meysing, D.M. et al., "Properties of reactively sputtered oxygenated cadmium sulfide (CdS:O) and their impact on CdTe solar cell performance," Journal of Vacuum Science & Technology, vol. A 33, pp. 021203-1 to 021203-7, (2015).

Naghavi, N. et al., "Buffer layers and transparent conducting oxides for chalcopyrite Cu(In,Ga)(S,Se)2 based thin film photovoltaics; present status and current developments," Prog. Photovolt; Res. Appl. 2010; Vo. 18, pp. 411-433, (2010).

Naghavi, N. et al., "Chemical deposition methods for Cd-free buffer layers in Ci(G)S solar cells: Role of window layers," Thin Solid Films, vol. 519, pp. 7600-7605, (2011).

Nakada, T. et al., "Direct evidence of Cd diffusion into Cu(In,Ga)Se2 thin films during chemical-bath deposition process of CdS films," Applied Physics Letters, vol. 74, No. 17, pp. 2444-2446, (1999).

Ramanathan, K. et al., "Prospects for in situ junction formation in CuInSe$_2$ based solar cells," Solar Energy Materials and Solar Cells, vol. 55, pp. 15-22, (1998).

Timoumi, A. et al., "Fabrication and characterization of In$_2$S$_3$ thin films deposited by thermal evaporation technique," Thin Solid Films, vols. 480-481, pp. 124-128, (2005).

Wu, X. et al., "High-Efficiency Polycrystalline CdTe Thin-Film Solar Cells with an Oxygenated Amorphous CdS (a-CdS:O) Window Layer," NREL/CP-520-31429, *To be presented at the 29th IEEE PV Specialists Conference New Orleans*, Louisiana May 20-24, 2002.

Zhang, S.B. et al., "Reconstruction and energetics of the polar (112) and (112) versus the nonpolar (220) surfaces of CuInSe2," Physical Review B, vol. 65, pp. 081402-1 to 081402-4, (2002).

\* cited by examiner

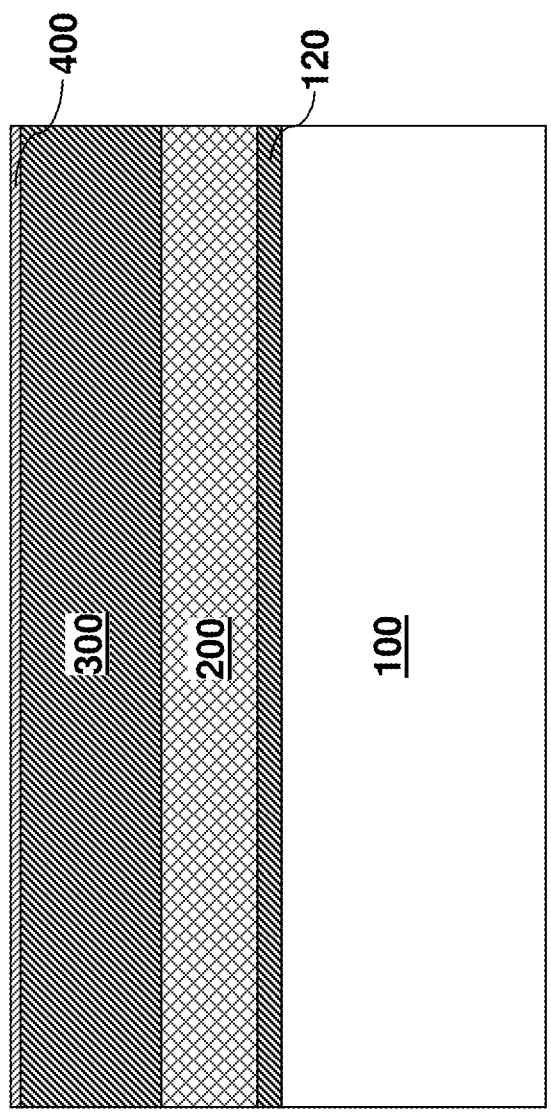

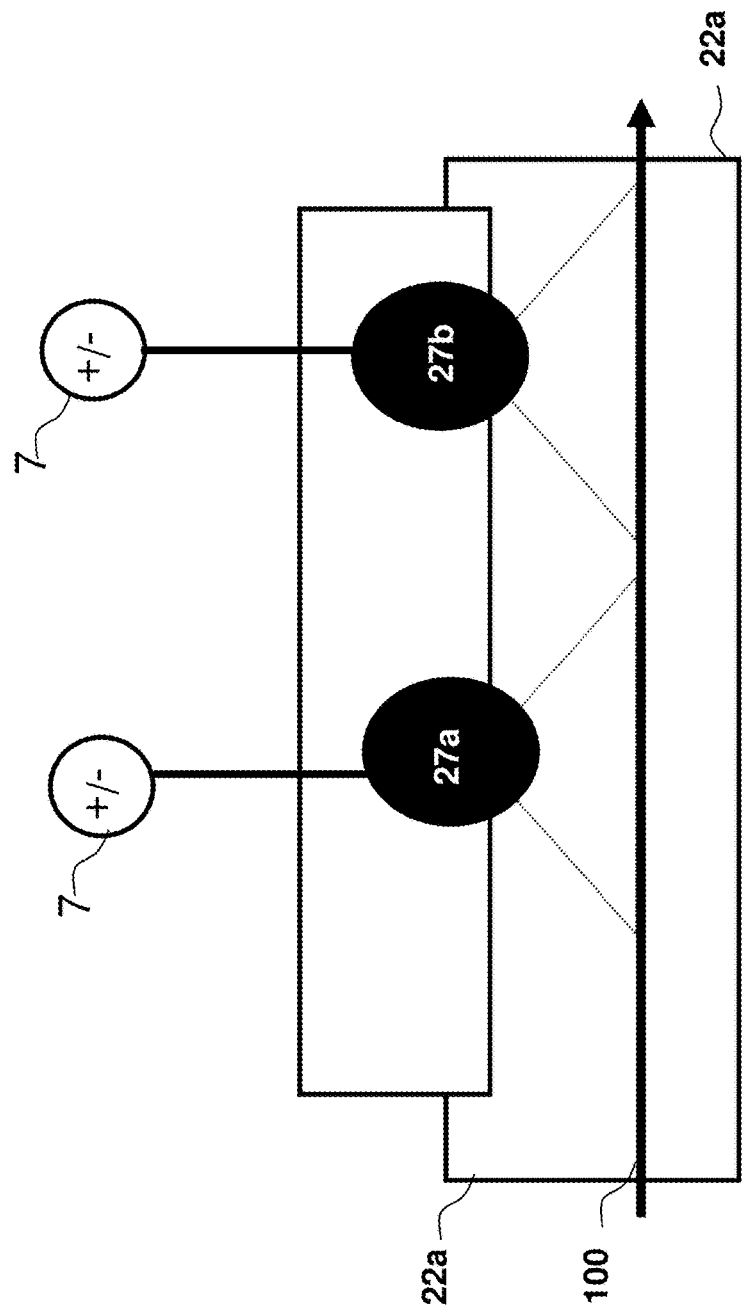

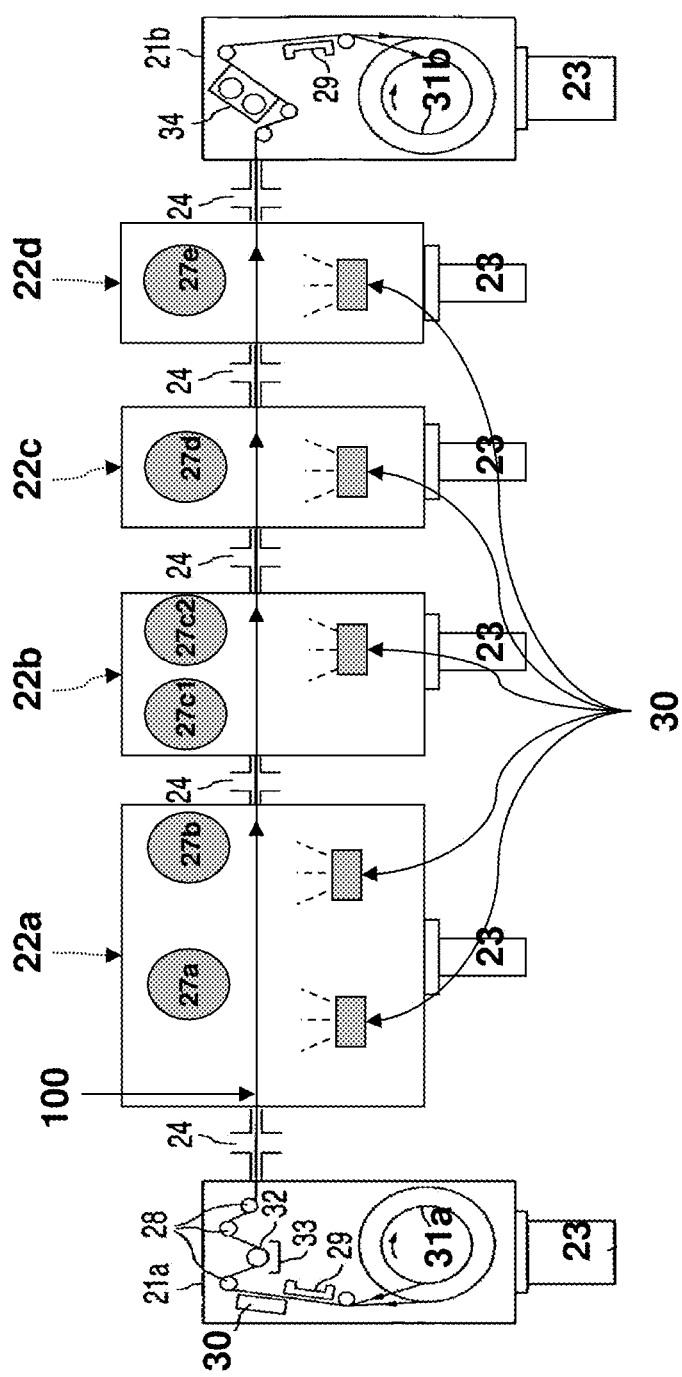

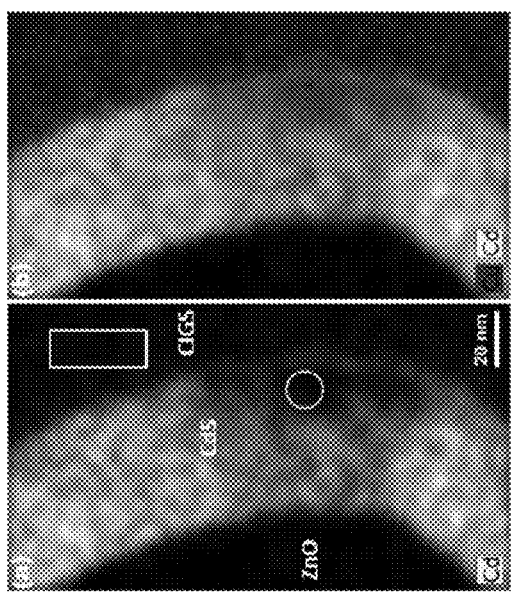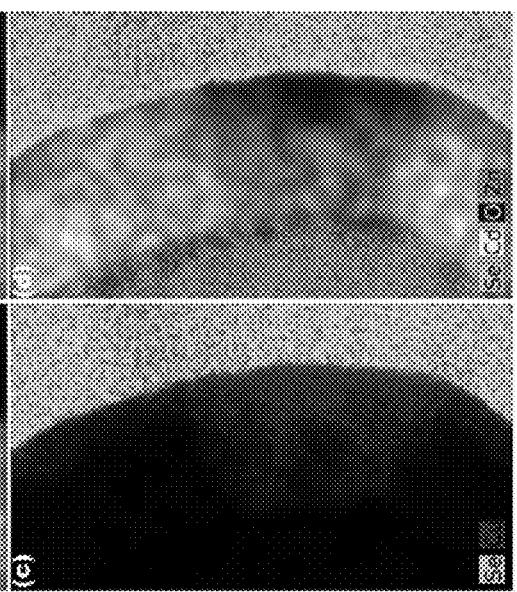
FIG. 7A  FIG. 7B
FIG. 7C  FIG. 7D

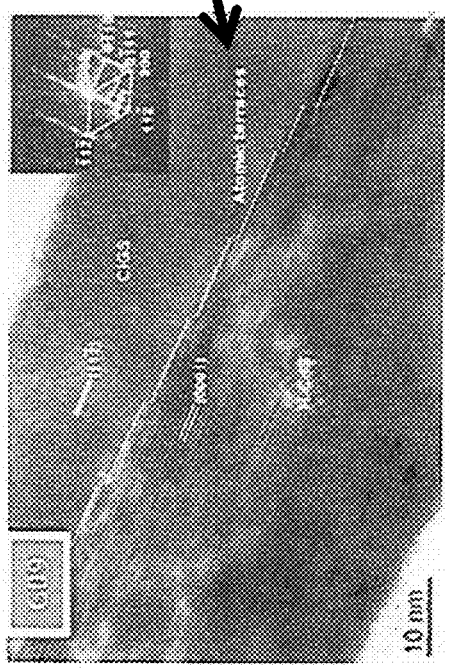
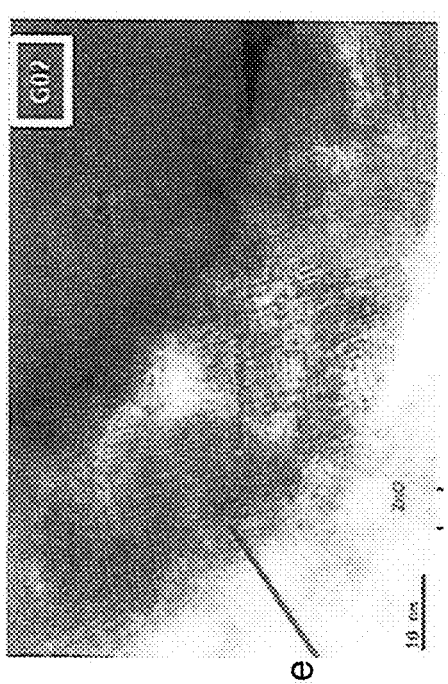
FIG. 13A
FIG. 13B

HEXAGONAL PHASE EPITAXIAL CADMIUM SULFIDE ON COPPER INDIUM GALLIUM SELENIDE FOR A PHOTOVOLTAIC JUNCTION

STATEMENT REGARDING FEDERALLY SPONSORED RESEARCH OR DEVELOPMENT

This invention was made with government support under grant number CPS 25853 awarded by the Department of Energy through the DOE/EERE SunShot BRIDGE program. The government has certain rights in the invention.

FIELD

The present invention relates generally to the field of photovoltaic devices, and more specifically to thin-film solar cells comprising a photovoltaic heterojunction between cadmium sulfide and copper indium gallium selenide.

BACKGROUND $CuIn_{1-x}Ga_xSe_2$ (CIGS) based thin film solar cells continue to show promise in the renewable energy market due to a steady gain in their solar energy conversion efficiencies in commercial scale devices. Cadmium sulfide is a thin film material used in conjunction with CIGS based thin film solar cells. An n-type cadmium sulfide layer is provided between a p-type absorber layer (as embodied as a CIGS film) and transparent conductive layer, and ensures efficient charge transport from the absorber to the electrical contact provided by the n-type transparent conductive oxide layer. The cadmium sulfide layer is commonly called a buffer or window layer when incorporated into a CIGS based thin film solar cell.

A cadmium sulfide layer can be typically formed by a chemical bath deposition (CBD) in a batch process. However, for vacuum deposited CIGS films, a chemical bath deposition process may not be a viable solution. It is practically impossible to integrate a chemical bath deposition process into a roll to roll deposition process, or a continuous deposition process, that deposits thin film solar cell materials.

Other methods of depositing a cadmium sulfide layer using physical vapor deposition are possible. One such method is magnetron sputtering under vacuum of a stoichiometric cadmium sulfide target to a surface of an absorber substrate (i.e., a CIGS film) to form a thin cadmium sulfide layer.

SUMMARY OF THE INVENTION

According to an aspect of the present disclosure, a method of manufacturing a photovoltaic structure includes forming a p-type semiconductor absorber layer comprising a copper indium gallium selenide based material over a first electrode, forming a n-type cadmium sulfide layer over the p-type semiconductor absorber layer by sputtering in ambient including hydrogen gas and oxygen gas, and forming a second electrode over the cadmium sulfide layer.

According to another aspect of the present disclosure, a photovoltaic structure comprises a first electrode comprising a metallic material, a p-type semiconductor absorber layer located over the first electrode, wherein the p-type semiconductor absorber layer includes a copper indium gallium selenide based material, a predominantly hexagonal phase cadmium sulfide layer located over the p-type semiconductor absorber layer, and a second electrode located over the cadmium sulfide layer.

According to another aspect of the present disclosure a photovoltaic structure, comprises a first electrode comprising a metallic material, a semiconductor absorber layer located over the first electrode, a cadmium sulfide layer located over the upper portion of the semiconductor absorber layer, and a second electrode located over the cadmium sulfide layer. The semiconductor absorber layer includes a p-n junction between a p-type copper indium gallium selenide semiconductor lower portion of the absorber layer and a n-type cadmium containing copper indium gallium selenide semiconductor upper portion of the absorber layer.

BRIEF DESCRIPTION OF THE DRAWINGS

FIGS. 1A-1C are sequential vertical cross-sectional views of an exemplary photovoltaic structure during manufacture according to an embodiment of the present disclosure.

FIG. 2 shows a highly simplified schematic diagram of a top view of a sputtering apparatus that can be used to forming a transition metal layer, such as an alkali-containing transition metal layer, for example, a sodium-containing molybdenum film.

FIG. 3 shows a highly simplified schematic diagram of a top view of a modular sputtering apparatus that can be used to manufacture the solar cell depicted in FIG. 1.

FIGS. 7A-7D show STEM-EDS maps of CdS/CIGS heterojunction in exemplary device G21 (no O doping in CdS). FIG. 7A shows a highly Cd depleted region is highlighted by a white circle. Energy dispersive spectroscopy (EDS) quantification from the region denoted by white rectangle suggests Cu deficient CIGS surface slightly doped by Cd. FIG. 7B shows that Cu is distributed through the whole CdS layer. FIG. 7C shows a Cu depletion surface layer filled by Se. FIG. 7D shows no pronounced Zn and O doping in CdS.

FIG. 9A shows no Cu presence in CdS. EDS quantification from the region marked by the rectangle suggests standard $Cu(In,Ga)Se_2$ phase. FIG. 9B show dotted lines which mark Se rich layer (Cu deficient). From FIG. 7A, Cd is found in this layer, indicating Cd substituting Cu. FIG. 9C shows that Zn is found in the entire CdS layer.

FIGS. 11A-11D show STEM-EDS maps of CdS/CIGS heterojunction in exemplary device G25 (medium O doping in CdS). FIG. 11A shows the presence of Cd in CIGS. EDS quantification from the region denoted by the white rectangle suggest about 7% Cd (atomic percentage). FIGS. 11B and 11C show Cu transportation into CdS. FIG. 11D shows that Zn is found in the outer portion of CdS.

FIGS. 13A-13B show STEM-EDS maps of CdS/CIGS heterojunction in exemplary devices G09 and G02 (medium O doping in CdS). The G09 device has a higher hydrogen to oxygen flow ratio ($O_2$—$H_2$ flow difference of negative 70 sccm) during CdS deposition than the G02 device ($O_2$—$H_2$ flow difference of negative 50 sccm). A single crystal hexagonal CdS layer with atomic terraces is observed in the G09 device in FIG. 13A, while nanocrystalline CdS is observed in the G02 device in FIG. 13B.

DETAILED DESCRIPTION

Figure 1B:
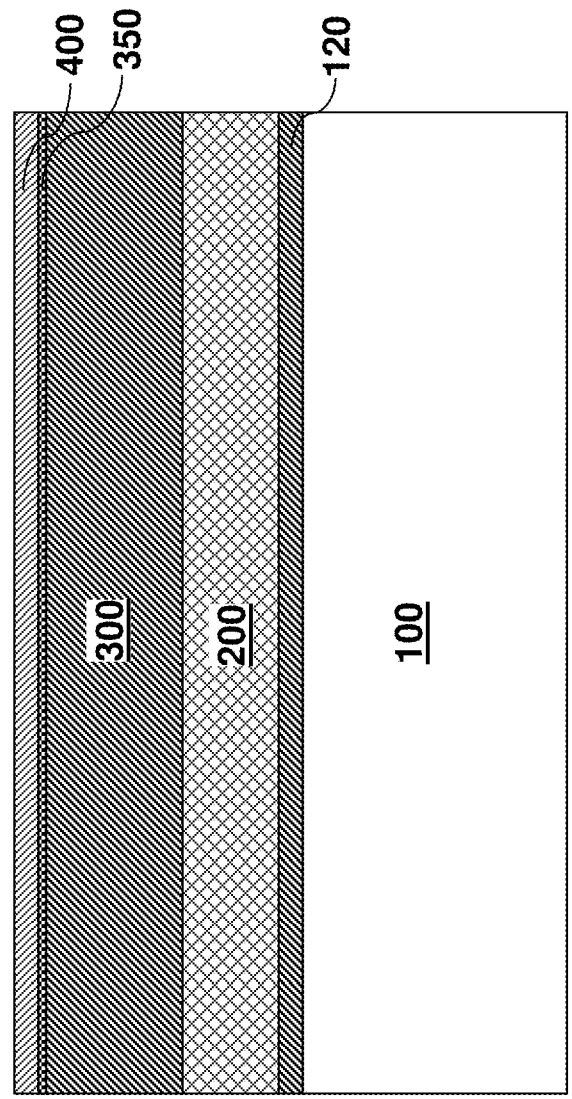

As discussed above, the present disclosure is directed to thin-film solar cells comprising a photovoltaic heterojunction between cadmium sulfide and copper indium gallium selenide, the various aspects of which are described below. The embodiments of the disclosure can be employed to form various photovoltaic devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

From the viewpoint of compatibility with the in-line vacuum production line, the "dry" non-vacuum break deposition of CdS, e.g., physical vapor deposition (PVD), is more favorable. However, PVD-CdS/CIGS devices were shown to deliver inferior efficiency compared to their CBD-CdS/CIGS counterparts. This difference cannot solely be explained by poor coverage of PVD-CdS buffer layer on CIGS surface as previously-thought. One possible explanation was that the lack of buried p-n homojunction in PVD-CdS/CIGS surface could be responsible.

The inventors of the present disclosure recognized that physical vapor deposition of cadmium sulfide induces intermixing of the growing CdS film and the CIGS absorber, thereby causing the resulting net deposited film stack to contain significant amounts of Cu and other elements that have migrated, diffused, or reacted with the CdS material during, or after, the growth, resulting in a composite film. The inventors of the present disclosure further recognized that such migrating species may have a negative effect on electrical device properties of the composite film, resulting in a poor quality device and low solar cell conversion efficiencies.

Further, the inventors of the present disclosure recognized that the inherent annealing of PVD-CdS/CIGS device during fabrication at the deposition temperature leads to a higher efficiency, stimulates a chemical interdiffusion process similar to that occurring during CBD-CdS process, and may result formation of a p-n homojunction on the CIGS surface or in the upper part of the CIGS layer due to Cd occupying Cu depletion sites of CIGS surface. This suggests that inherent diffusion of atoms during of PVD-CdS/CIGS solar cells of the present disclosure may be an important mechanism for formation of suitable phases that enhance the solar cell performance.

During the course of the research leading to the present disclosure, the inventors investigated microstructural and chemical nature of the PVD (i.e., sputter) deposited CdS/CIGS heterojunction and found large CdS domains (e.g., single crystal regions) of both zincblende (i.e., cubic) phase and wurtzite (i.e., hexagonal) phase epitaxially grown on CIGS surface which are not usually formed during CBD CdS process. Without wishing to be bound by a particular theory, the present inventors believe that this may have significant implications in terms of possible photo-generated carrier collection in the buffer layer since the present inventors believe that observable photocurrent in the buffer layer is not present in prior art CdS/CIGS solar cells.

Figure 1C:
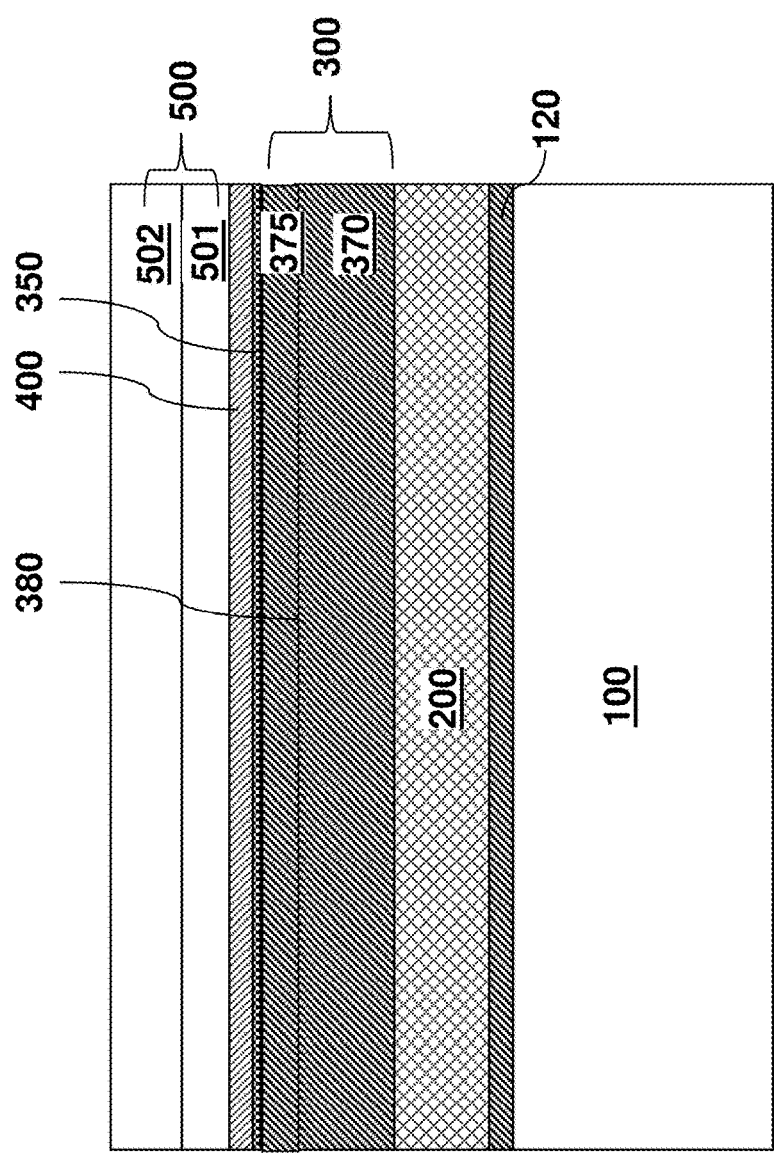

FIGS. 1A-1C illustrate sequential vertical cross-sectional views of an exemplary photovoltaic structure according to an embodiment of the present disclosure. FIG. 1A is an in-process exemplary photovoltaic structure after during deposition of a cadmium sulfide layer 400 on a p-type semiconductor absorber layer 300. As used herein, a "prototype" structure or an "in-process" structure refers to a transient structure that is subsequently modified in the shape or composition of at least one component therein.

The in-process photovoltaic structure of FIG. 1A can be formed by providing a substrate 100, forming a first electrode 200 on the substrate, forming a p-type semiconductor absorber layer 300 on the first electrode 200, and forming the cadmium sulfide layer 400 on the surface of the p-type semiconductor absorber layer 300. The in-process photovoltaic structure of FIG. 1A corresponds to a point in time during deposition of the cadmium sulfide layer 400 in a process chamber (not shown).

Prior to formation of the p-type semiconductor absorber layer 300, the first electrode 200 can be formed on the substrate 100. The first electrode 200 comprises a transition metal layer 200. The substrate 200 can be any type of substrate (such as an insulator substrate, a conductive substrate, or a semiconductor substrate). In one embodiment, the substrate 100 can be an insulator substrate including an insulator material, such as soda lime glass or sapphire. Alternatively, the substrate 100 can be a metal substrate such as a stainless steel or aluminum substrate. The substrate 100 may be amorphous, polycrystalline, or crystalline.

The transition metal of the transition metal layer 200 may be any suitable transition metal, for example but not limited to Mo, W, Ta, V, Ti, Nb, and Zr. Optionally, the transition metal layer 200 may contain at least one alkali element and/or at least one alkali compound (such as one or more of Li, Na, and K, and compounds thereof). In a non-limiting example, the transition metal layer 200 may predominantly comprise molybdenum (i.e., more than 50% in atomic concentration of molybdenum).

The transition metal layer 200 may have a thickness of 100 to 500 nm, for example 200 to 400 nm such as around 300 nm. In some embodiments, the transition metal layer 200 may comprise multiple sub-layers, (for example 1 to 20 sub-layers such as 1 to 10 sub-layers) having different atomic compositions.

Optionally, an alkali diffusion barrier layer 120 may be provided between the substrate 100 and the transition metal layer 200. Additional barrier and/or adhesion layers (not shown), such as Cr and/or metal nitride layers may be further disposed between the electrode 200 and the substrate 100, for example between the optional alkali diffusion barrier layer 120 and the substrate 100. The optional alkali diffusion barrier layer 120 may comprise any suitable materials. For example, they may be independently selected from a group consisting Mo, W, Ta, V, Ti, Nb, Zr, Cr, TiN, ZrN, TaN, VN, $V_{2N}$ or combinations thereof. The alkali diffusion barrier layer 120 can substantially reduce or prevent alkali diffusion from the transition metal layer 200 into the substrate 100.

The p-type semiconductor absorber layer 300 is subsequently deposited on the transition metal layer 200. The p-type semiconductor absorber layer 300 may comprise a CIGS based alloy material selected from copper indium selenide, copper indium gallium selenide, copper indium aluminum selenide, or combinations thereof. The p-type semiconductor absorber layer 300 may have a stoichiometric composition having a Group I to Group III to Group VI atomic ratio of about 1:1:2, or a non-stoichiometric composition having an atomic ratio of other than about 1:1:2. Preferably, The p-type semiconductor absorber layer 300 is slightly copper deficient and has a slightly less than one copper atom for each one of Group III atom and each two of Group VI atoms.

The step of depositing the p-type semiconductor absorber layer 300 may comprise reactively AC sputtering the component materials of the p-type semiconductor absorber layer 300 from at least two electrically conductive targets in a sputtering atmosphere that comprises argon gas and a selenium containing gas (e.g. selenium vapor or hydrogen selenide). For example, each of the at least two electrically conductive targets comprises copper, indium and gallium; and the CIGS based alloy material comprises copper indium gallium diselenide. The thickness of the p-type semiconductor absorber layer 300 can be in a range from 100 nm to 10,000 nm, although lesser and greater thicknesses can also be employed.

In one embodiment, the p-type semiconductor absorber layer 300 can be a CIGS material that is formed in a chalcopyrite phase. A predominant portion of the surfaces of the CIGS material can be formed with {112} facets and {220} facets.

A cadmium sulfide layer 400 may then be deposited over the p-type semiconductor absorber layer 300. The cadmium sulfide layer 400 may comprise any suitable doped or undoped n-type cadmium sulfide semiconductor materials, for example, but not limited to undoped CdS or doped CdS, such as (Cu,Cd)S, (Zn,Cd)S, (Zn,Cd,Cu)S, (Zn,Cd)(S,O) and/or (Zn,Cd,Cu)(S,O). Generally, the CdS layer is formed as an n-doped material due to native defects, which care sulfur vacancies. A CdS material having an n-type doping provided by natural process of formation without externally introduced dopants is herein referred to as an intrinsically doped CdS material. Such an n-doped CdS layer is a preferred doping state for the cadmium sulfide layer 400. As will be described below, the process parameters for deposition of the cadmium sulfide layer 400 can be selected such that the cadmium sulfide material in the cadmium sulfide layer 400 is formed with a single crystalline, hexagonal phase layer or regions. In one embodiment, the predominant crystallographic orientation along the direction of growth can be the <0002> direction.

Referring to FIG. 1B, the process parameters for deposition of the cadmium sulfide layer 400 are selected such that copper from the CIGS based alloy material in the p-type semiconductor absorber layer 300 can diffuse to the interface with the cadmium sulfide layer 400 to form an optional interlayer comprising $Cu_{1-x}Cd_xS$ between the p-type semiconductor absorber layer 300 and the cadmium sulfide layer 400. The value of x can be in a range from 0.01 to 0.3, although lesser and greater values can also be employed. The optional interlayer is herein referred to as a copper cadmium sulfide layer 350. The copper cadmium sulfide layer 350 preferably comprises regions or entire layer comprising single crystalline hexagonal crystal structure In one alternative embodiment, layer 350 may have a single crystalline cubic crystal structure or a polycrystalline or nanocrystalline structure. In another alternative embodiment, if copper does not diffuse into the cadmium sulfide layer 400, then layer 350 may be omitted entirely. In yet another alternative embodiment, if copper diffuses through the entire thickness of cadmium sulfide layer 400 to a second electrode 500, then the entire cadmium sulfide layer 400 becomes a copper cadmium sulfide layer and the intermediate layer 350 is omitted.

Formation of the hexagonal phase copper cadmium sulfide layer 350 may occurs only in a small subset of device deposition parameters. In other words, formation of the hexagonal phase copper cadmium sulfide layer 350 during deposition of cadmium sulfide layer 400 is neither automatic nor trivial, but preferably results from intentional selection of the partial pressures of hydrogen and oxygen during sputter deposition of the cadmium sulfide layer 400. Details of process conditions for the formation of the hexagonal phase copper cadmium sulfide layer 350 are described below in a separate section.

The thickness of the hexagonal phase copper cadmium sulfide layer 350 depends on the process conditions, and can be in a range from 0.5 nm to 10 nm, although lesser and greater thicknesses can also be employed. The thickness of the cadmium sulfide layer 400 can be in a range from 30 nm to 60 nm, although lesser and greater thicknesses can also be employed.

Referring to FIG. 1C, a second electrode 500, also referred to as a transparent top electrode, can be deposited over the cadmium sulfide layer 400. The transparent top electrode 500 may comprise multiple transparent conductive layers, for example, but not limited to, one or more of an Indium Tin Oxide (ITO), Zinc Oxide (ZnO) or Aluminum Zinc Oxide (AZO) (e.g., having a high aluminum content of 1-3 at %) layers 502 located over an optional resistive Aluminum Zinc Oxide (RAZO) layer 501 (e.g., having a low aluminum content of below 0.2 at %). Optionally, the transparent top electrode 500 may comprise any other suitable materials, for example, doped ZnO or SnO.

Optionally, one or more antireflection (AR) films (not shown) may be deposited over the transparent top electrode 500, to optimize the light absorption in the cell, and/or current collection grid lines may be deposited over the top conducting oxide.

A solar cell described above may be fabricated by any suitable methods. In one embodiment, a method of manufacturing such a solar cell comprises providing a substrate 100, depositing a first electrode 200 over the substrate 100, depositing a p-type semiconductor absorber layer 300 over the first electrode 200, depositing a cadmium sulfide layer 400 over the p-type semiconductor absorber layer 300, and depositing a second electrode 500 over the cadmium sulfide layer 400. The step of depositing the first electrode 200 comprises depositing the transition metal layer 200. While sputtering was described as the preferred method for depositing all layers onto the substrate, some layers may be deposited by MBE, CVD, evaporation, plating, etc. In some embodiments, one or more sputtering steps may be reactive sputtering.

Figure 1D:
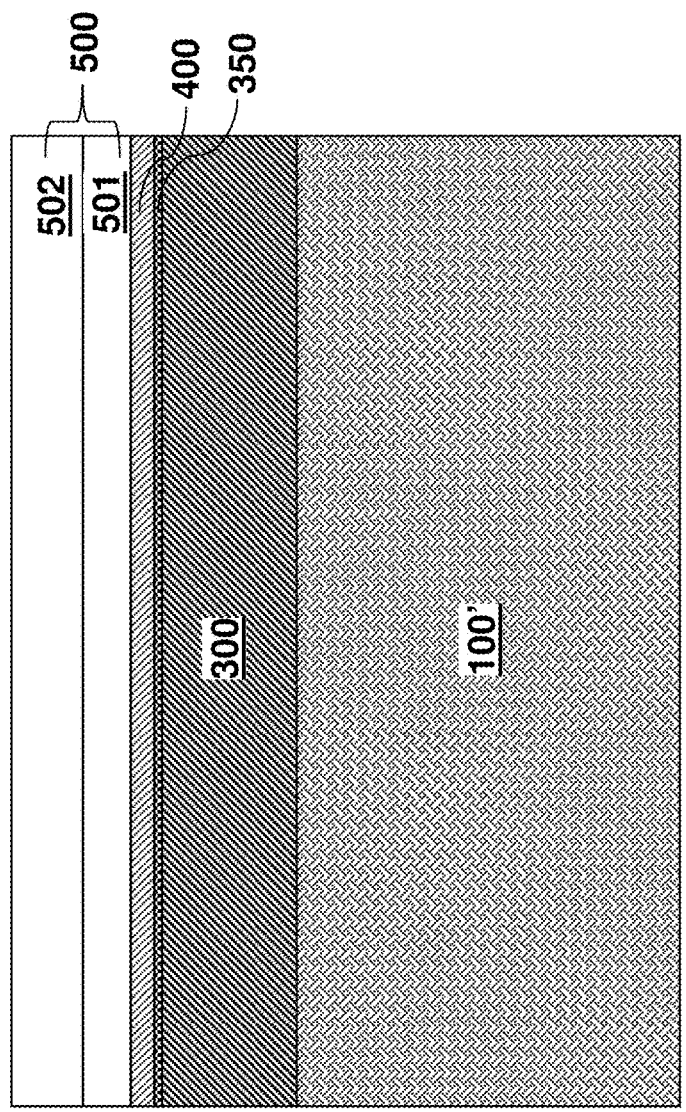
FIG. 1D is a vertical cross-sectional view of an alternate embodiment of the exemplary photovoltaic structure according to an embodiment of the present disclosure.

Referring to FIG. 1D, an alternate embodiment of the exemplary photovoltaic structures is shown, which can be derived from the exemplary photovoltaic structures of FIGS. 1A-1C by substituting a substrate 100' comprising a conductive material for the combination of a substrate 100, an optional alkali diffusion barrier layer 120, and a transition metal layer 200. The conductive material may be a metallic material such as stainless steel. In one embodiment, the substrate 100' may be provided as a foil web.

In one embodiment, the transition metal layer (not shown in FIG. 2, and referred to as layer 200 in FIG. 1) may be deposited over a substrate 100 by using a sputtering apparatus illustrated in FIG. 2. In one embodiment, targets comprising a transition metal (e.g., 27a and 27b) are located in a sputtering process module 22a, such as a vacuum chamber. In this non-limiting example, the transition metal targets 27a and 27b are rotating Mo cylinders and are powered by DC power sources 7. Optionally, oxygen and/or sodium may be added to the molybdenum transition metal targets 27a and 27b or additional second target(s) containing an alkali (e.g., sodium) compound may be added to the module 22a, as described in U.S. Pat. No. 8,134,069, incorporated herein by reference in its entirety.

In some embodiments, the step of depositing the transition metal layer 200 may be conducted in an oxygen and/or nitrogen rich environment, and may comprise DC sputtering the transition metal from the first target and pulsed DC sputtering, AC sputtering, or RF sputtering the alkali compound from the second target. Any suitable variations of the sputtering methods may be used. For example, for electrically insulating second target materials, AC sputtering refers to any variation of AC sputtering methods that may be used to for insulating target sputtering, such as medium frequency AC sputtering or AC pairs sputtering. In one embodiment, the step of depositing the transition metal layer may comprise DC sputtering a first target comprising a transition metal, such as molybdenum, and pulsed DC sputtering, AC sputtering, or RF sputtering a second target comprising alkali-containing material, such as a sodium-containing material, in an oxygen rich sputtering environment.

The substrate 100 may be a foil web, which can be, for example, a metal web substrate, a polymer web substrate, or a polymer coated metal web substrate. The substrate 100 may be continuously passing through the sputtering module 22a during the sputtering process, following the direction of the imaginary arrow along the foil web 100. Any suitable materials may be used for the foil web 100. For example, metal (e.g., stainless steel, aluminum, or titanium) or thermally stable polymers (e.g., polyimide or the like) may be used. The foil web 100 may move at a constant or variable rate to enhance intermixing.

In one embodiment, the transition metal is molybdenum, and the transition metal layer 200 comprises molybdenum with optional dopants, which may be intentional or unintentional.

In some embodiments, the step of sputtering the alkali diffusion barrier layer 120 occurs under a first sputtering environment in a first vacuum chamber of a magnetron sputtering system, while the step of sputtering the transition metal layer 200 occurs under a second sputtering environment in a second vacuum chamber of the magnetron sputtering system different from the first vacuum chamber. The second sputtering environment differs from the first sputtering environment in at least one of argon pressure, oxygen pressure, or nitrogen pressure. For example, the step of sputtering the alkali diffusion barrier layer 120 may occur from a transition metal target in a substantially oxygen free atmosphere, while the step of sputtering the transition metal layer 200 occurs in an atmosphere containing both oxygen and hydrogen.

For example, in some embodiments, the step of depositing the alkali diffusion barrier layer 120 may comprise sputtering from a metal target under 0.8 to 1.2 mTorr pressure such as around 1 mTorr or less in an inert environment. The step of depositing the transition metal layers 200 can comprise sputtering from a transition metal target(s) under a pressure in a range from 5 to 10 mTorr pressure in an atmosphere containing both oxygen and hydrogen. The sputtering power used for depositing the alkali diffusion barrier layer 120 and depositing the transition metal layer 200 may also be different. For example, the sputtering power used for depositing the alkali diffusion barrier layer 120 may be higher or lower than that used for depositing the transition metal layer 200.

In some embodiments, the step of depositing the alkali diffusion barrier layer 120, the step of depositing the transition metal layer 200, the step of depositing the p-type semiconductor absorber layer 300, the step of depositing the cadmium sulfide layer 400, and the step of depositing the second electrode 500 can comprise sputtering respective materials over the substrate 100 (which may be a foil web) in corresponding process modules of a plurality of independently isolated, connected process modules without breaking vacuum, while passing the web substrate 100 from an input module to an output module through the plurality of independently isolated, connected process modules such that the web substrate 100 continuously extends from the input module to the output module while passing through the plurality of the independently isolated, connected process modules. Each of the process modules may include one or more sputtering targets for sputtering material over the web substrate 100.

For example, a modular sputtering apparatus for making the solar cell, as illustrated in FIG. 3 (top view), may be used for depositing the layers. The apparatus is equipped with an input, or load, module 21a and a symmetrical output, or unload, module 21b. Between the input and output modules are process modules 22a, 22b, 22c and 22d. The number of process modules 22 may be varied to match the requirements of the device that is being produced. Each module has a pumping device 23, such as vacuum pump, for example a high throughput turbomolecular pump, to provide the required vacuum and to handle the flow of process gases during the sputtering operation. Each module may have a number of pumps placed at other locations selected to provide optimum pumping of process gases. The modules are connected together at slit valves 24, which contain very narrow low conductance isolation slots to prevent process gases from mixing between modules. These slots may be separately pumped if required to increase the isolation even further. Other module connectors 24 may also be used. Alternatively, a single large chamber may be internally segregated to effectively provide the module regions, if desired. U.S. Published Application No. 2005/0109392 A1 ("Hollars"), filed on Oct. 25, 2004, discloses a vacuum sputtering apparatus having connected modules, and is incorporated herein by reference in its entirety.

The web substrate 100 is moved throughout the machine by rollers 28, or other devices. Additional guide rollers may be used. Rollers shown in FIG. 3 are schematic and non-limiting examples. Some rollers may be bowed to spread the web, some may move to provide web steering, some may provide web tension feedback to servo controllers, and others may be mere idlers to run the web in desired positions. The input spool 31a and optional output spool 31b thus are actively driven and controlled by feedback signals to keep the web in constant tension throughout the machine. In addition, the input and output modules may each contain a web splicing region or device 29 where the web 100 can be cut and spliced to a leader or trailer section to facilitate loading and unloading of the roll. In some embodiments, the web 100, instead of being rolled up onto output spool 31b, may be sliced into solar modules by the web splicing device 29 in the output module 21b. In these embodiments, the output spool 31b may be omitted. As a non-limiting example, some of the devices/steps may be omitted or replaced by any other suitable devices/steps. For example, bowed rollers and/or steering rollers may be omitted in some embodiments.

Heater arrays 30 are placed in locations where necessary to provide web heating depending upon process requirements. These heaters 30 may be a matrix of high temperature quartz lamps laid out across the width of the web. Infrared sensors provide a feedback signal to servo the lamp power and provide uniform heating across the web. In one embodiment, as shown in FIG. 3, the heaters are placed on one side of the web 100, and sputtering targets (27a, 27b, 27c1, 27c2, 27d, 27e) are placed on the other side of the web 100. Sputtering targets (27a, 27b, 27c1, 27c2, 27d, 27e) may be mounted on dual cylindrical rotary magnetron(s), or planar magnetron(s) sputtering sources, or RF sputtering sources.

After being pre-cleaned, the web substrate 100 may first pass by heater array 30f in module 21a, which provides at least enough heat to remove surface adsorbed water. Subsequently, the web can pass over roller 32, which can be a special roller configured as a cylindrical rotary magnetron. This allows the surface of electrically conducting (metallic) webs to be continuously cleaned by DC, AC, or RF sputtering as it passes around the roller/magnetron. The sputtered web material is caught on shield 33, which is periodically changed. Preferably, another roller/magnetron may be added (not shown) to clean the back surface of the web 100. Direct sputter cleaning of a web 100 will cause the same electrical bias to be present on the web throughout the machine, which, depending on the particular process involved, might be undesirable in other sections of the machine. The biasing can be avoided by sputter cleaning with linear ion guns instead of magnetrons, or the cleaning could be accomplished in a separate smaller machine prior to loading into this large roll coater. Also, a corona glow discharge treatment could be performed at this position without introducing an electrical bias.

Next, the web 100 passes into the process module 22a through valve 24. Following the direction of the imaginary arrows along the web 100, the full stack of layers may be deposited in one continuous process. The transition metal layer 200 may be sputtered in the process module 22a over the web 100, as illustrated in FIG. 3 (and previously in FIG. 1). Optionally, the process module 22a may include at least one transition metal target (27a, 27b).

The web 100 then passes into the next process module, 22b, for deposition of the p-type semiconductor absorber layer 300. In a preferred embodiment shown in FIG. 3, the step of depositing the p-type semiconductor absorber layer 300 includes reactively alternating current (AC) magnetron sputtering the semiconductor absorber layer from at least one pair of two conductive targets 27c1 and 27c2, in a sputtering atmosphere that comprises argon gas and a selenium-containing gas. In some embodiment, the pair of two conductive targets 27c1 and 27c2 comprise the same targets. For example, each of the at least two conductive targets 27c1 and 27c2 comprises copper, indium and gallium, or comprises copper, indium and aluminum. The selenium-containing gas may be hydrogen selenide or selenium vapor. In other embodiments, targets 27c1 and 27c2 may comprise different materials from each other. The radiation heaters 30 maintain the web at the required process temperature, which can be an elevated temperature in a range from 400° C. to 800° C. (which may be a range from 500° C. to 700° C.) which is preferable for the CIGS based alloy deposition.

Figure 4:
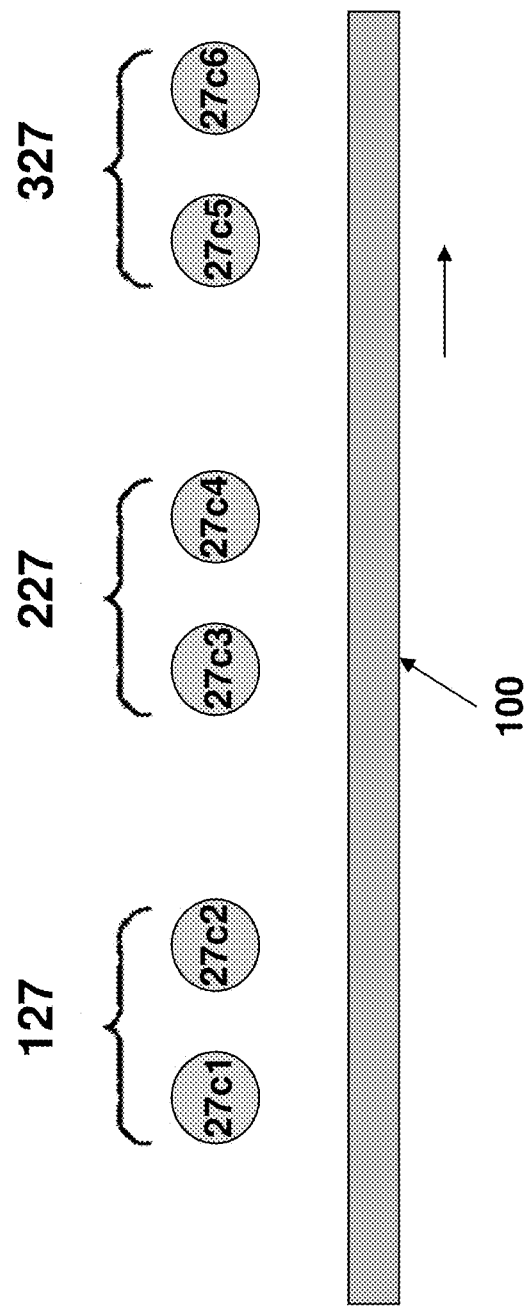
FIG. 4 illustrates schematically the use of three sets of dual magnetrons to increase the deposition rate and grade the composition of the CIGS layer to vary its band gap.

In some embodiments, the p-type semiconductor absorber layer 300 may comprise graded CIGS based material. In this embodiment, the process module 22b further comprises at least two more pairs of targets (227, and 327), as illustrated in FIG. 4. The first magnetron pair 127 (27c1 and 27c2) are used to sputter a layer of copper indium diselenide while the next two pairs 227, 327 of magnetrons targets (27c3, 27c4 and 27c5, 27c6) sputter deposit layers with increasing amounts of gallium (or aluminum), thus increasing and grading the band gap. The total number of targets pairs may be varied, for example may be 2-10 pairs, such as 3-5 pairs. This will grade the band gap from about 1 eV at the bottom to about 1.3 eV near the top of the layer. Details of depositing the graded CIGS material is described in the Hollars published application, which is incorporated herein by reference in its entirety.

In some embodiments, one or more process modules (not shown) may be further added between the process modules 21a and 22a to sputter a back side protective layer over the back side of the substrate 100 before the first electrode 200 is deposited on the front side of the substrate. U.S. Pat. No. 8,115,095, which is hereby incorporated by reference, describes such deposition process.

The web 100 may then pass into the process modules 22c and 22d, for depositing the cadmium sulfide layer 400, and the transparent top electrode 500, respectively. Any suitable type of sputtering sources may be used, for example, rotating AC magnetrons, RF magnetrons, or planar magnetrons. Extra magnetron stations (not shown), or extra process modules (not shown) could be added for sputtering the optional one or more AR layers.

Finally, the web 100 passes into output module 21b, where it is either wound onto the take up spool 31b, or sliced into solar cells using cutting apparatus 29.

According to the methods of the present disclosure, the cadmium sulfide material can be deposited using reactive sputtering in a highly controlled high vacuum environment and with vacuum handling of the CIGS absorber (i.e., without physically exposing the surfaces of the CIGS absorber to atmospheric ambient). Thus, controlled doped or undoped cadmium sulfide growth conditions can be provided, and epitaxial growth of doped or undoped cadmium sulfide with hexagonal phase crystalline structure can be achieved directly on or over a CIGS absorber layer. The method of the present disclosure preserves the advantageous properties of the intrinsic cadmium sulfide material without copper interdiffusion, or with minimal copper interdiffusion, while enhancing electronic transport with epitaxial alignment of the cadmium sulfide material to the absorber layer.

A high conversion efficiency thin film solar cell material can be provided employing a PVD deposited cadmium sulfide material deposited employing the method of the present disclosure.

As discussed above, formation of the optional hexagonal phase copper cadmium sulfide layer 350 occurs only in a small subset of a process window. Exemplary conditions for formation of the hexagonal phase copper cadmium sulfide layer 350 during, and immediately after, deposition of the cadmium sulfide layer 400 (i.e., while the temperature of the substrate is elevated at, or near, the deposition temperature for the cadmium sulfide layer 400) are discussed below. Alternatively, as noted above, if copper diffuses through the entire thickness of cadmium sulfide layer 400, then cadmium sulfide layer 400 becomes the copper cadmium sulfide layer and layer 350 is omitted.

The intermixing of species between CIGS and CdS is controlled by modifying the composition and the crystal structure of the deposited CdS material employing a combination of oxygen gas and hydrogen gas during the physical vapor deposition process (e.g., reactive magnetron sputtering) that deposits the cadmium sulfide layer 400.

Addition of oxygen gas to the physical vapor deposition process modifies the crystallinity of the resulting CdS film, and thus, controls the amount of interdiffusion of species from the CIGS material into the CdS material. Thus, by varying the amount of oxygen in the physical vapor deposition process, the crystallinity and the grain size of the deposited CdS material continuously changes from a fully amorphous material in the case of a high oxygen partial pressure (for example, greater than about 1.5 mTorr) to a fully epitaxial material in the case of substantially zero partial pressure (for example, less than 0.1 mTorr). The addition of oxygen alone can modify the electronic properties of a deposited cadmium sulfide film.

Introduction of hydrogen in addition to oxygen can provide simultaneous tunability of crystallinity and charge carrier mobility. According to an embodiment of the present disclosure, oxygen gas can be added into a reactive magnetron sputter deposition process for cadmium sulfide at flow levels from about 1 sccm to about 100 sccm (corresponding to a partial pressure from about 0.025 mTorr to about 2.5 mTorr) to modify the crystal structure and the composition of the deposited cadmium sulfide material to reduce or prevent copper diffusion through the cadmium sulfide material. According to an embodiment of the present disclosure, hydrogen gas can be added into the reactive magnetron sputter deposition process concurrently with addition of the oxygen gas at flow levels from about 1 sccm to about 200 sccm (corresponding to a partial pressure from about 0.025 mTorr to about 5 mTorr) to modulate the oxygen content in the cadmium sulfide material and to increase the mobility of charge carriers within the cadmium sulfide material. For reasons not fully understood yet, hydrogen in combination with oxygen greatly enhances both the crystal quality and the diffusion of Cd into the CIGS material.

Figure 5:
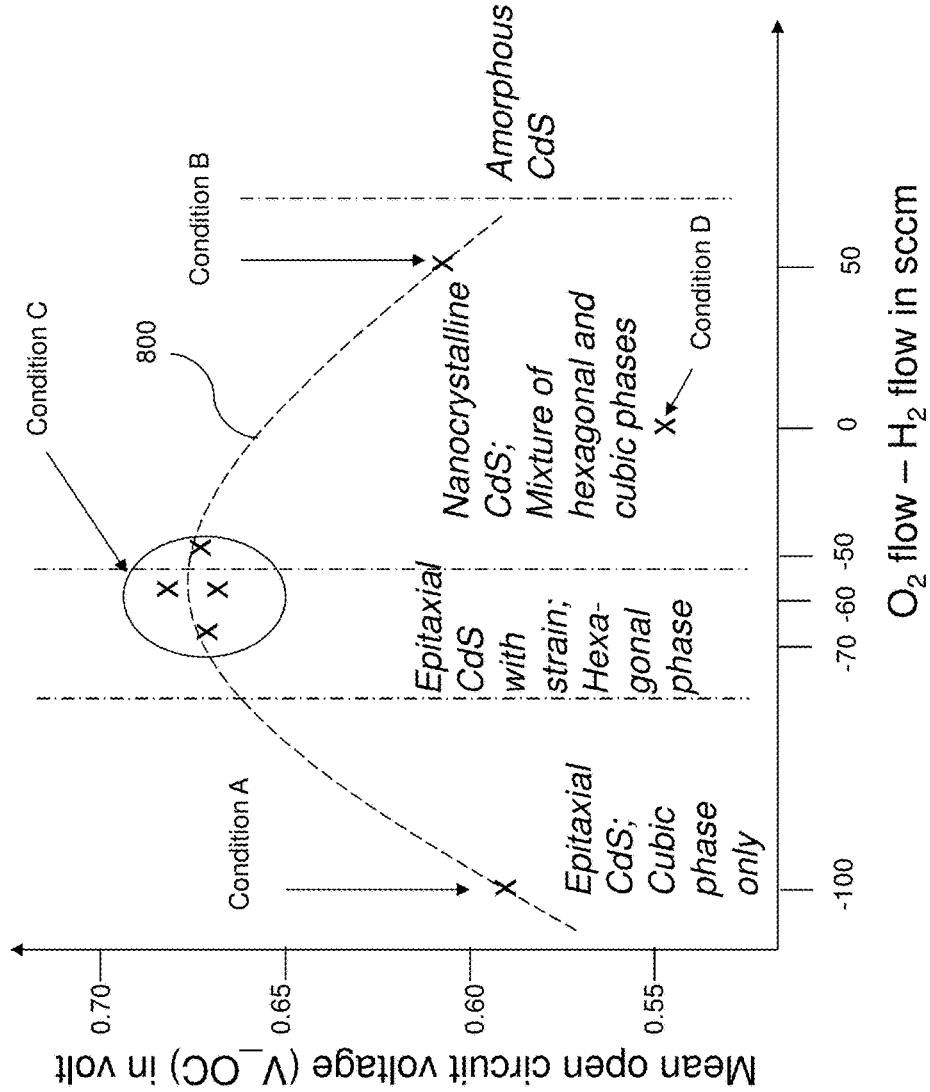
FIG. 5 is a graph illustrating the dependency of mean open circuit voltage of sample photovoltaic devices formed under various cadmium sulfide deposition methods.

Low levels of net oxygen addition (e.g., using only hydrogen but not oxygen in the sputtering chamber ambient during sputtering) generates epitaxial cadmium sulfide having a cubic phase on the CIGS material. The cubic phase epitaxial cadmium sulfide material permits rapid copper diffusion therethrough, thereby forming undesirable p-type $Cu_2S$ regions which reduces the effect of the n-type of doping present in the CdS layer. This process regime corresponds to regime including process condition A in FIG. 5. Regarding the undesirability of such p-type $Cu_2S$ regions, p-type $Cu_2S$ regions can greatly increase the sensitivity to recombination defects on the CIGS/CdS interface, thereby reducing open circuit voltage and efficiency of a solar cell. Large domains of $Cu_2S$ may even form own junctions with the CdS, which is difficult to control for practical purposes. The process parameters for process condition A correspond to:

Argon flow rate into the physical vapor deposition chamber: 190 sccm;

Hydrogen flow rate into the physical vapor deposition chamber: 100 sccm;

Oxygen flow rate into the physical vapor deposition chamber: 0 sccm;

Estimated partial pressure of argon during deposition: 4.75 mTorr;

Estimated partial pressure of hydrogen during deposition: 2.5 mTorr; and

Estimated partial pressure of oxygen during deposition: less than $1.0 \times 10^{-6}$ Torr.

In contrast, high level of net oxygen addition (and no hydrogen addition) to the sputtering chamber ambient generates amorphous or nanocrystalline cadmium sulfide. If nanocrystalline cadmium sulfide material is formed, the crystallographic orientations of the cadmium sulfide material is generally a mixture of hexagonal and cubic phases with almost random crystallographic orientations along the direction of growth (i.e., along the direction perpendicular to the interface between the p-type semiconductor absorber layer 300 and the cadmium sulfide layer 400). In this case, diffusion of copper from the CIGS material into the cadmium sulfide material is prevented. Further, the zinc from the second electrode 500 can rapidly diffuse into the cadmium sulfide layer 400. In some cases, a (Zn,Cd)S composition or a (Zn,Cd)(S,O) composition can be formed if both zinc and oxygen diffuse from the second electrode 500 into the cadmium sulfide layer 400. For example, if the second electrode 500 comprises zinc oxide (ZnO) or resistive aluminum zinc oxide (RAZO), zinc can diffuse into the cadmium sulfide layer. Without wishing to be bound by a particular theory, it is postulated that Zn diffusion into the cadmium sulfide layer may enhance electrical properties of the cadmium sulfide layer 400. This process regime corresponds to regime including process condition B in FIG. 5. The process parameters for process condition B correspond to:

Argon flow rate into the physical vapor deposition chamber: 190 sccm;

Hydrogen flow rate into the physical vapor deposition chamber: 0 sccm;

Oxygen flow rate into the physical vapor deposition chamber: 40 sccm;

Estimated partial pressure of argon during deposition: 4.75 mTorr;

Estimated partial pressure of hydrogen during deposition: less than $1.0 \times 10^{-6}$ Torr; and Estimated partial pressure of oxygen during deposition: 1 mTorr.

Optimal (e.g., medium) levels of net oxygen and hydrogen addition to the sputtering chamber ambient induce deposition of an epitaxial cadmium sulfide material having a hexagonal phase over the CIGS material. At the deposition temperature employed to deposit the epitaxial cadmium sulfide material, cadmium atoms in the epitaxial cadmium sulfide material may diffuse into the CIGS material, and copper atoms in the CIGS material may diffuse into the epitaxial cadmium sulfide material, thereby replacing a portion of the cadmium atoms with copper atoms and vice-versa at an interface between the CIGS material and the deposited epitaxial cadmium sulfide material having the hexagonal phase. Without wishing to be bound by a particular theory, a possible mechanism for formation of the hexagonal phase copper cadmium sulfide layer 350 may be the replacement of the cadmium atoms with the copper atoms. Without wishing to be bound by a particular theory, it is postulated that formation of a hexagonal phase cadmium sulfide layer may tend to inhibit further copper diffusion into the hexagonal cadmium sulfide layer, potentially rendering the copper diffusion self-limiting. The replacement of copper atoms with cadmium atoms (filling of vacancies with cadmium atoms) in the p-type semiconductor absorber layer 300 generates potentially beneficial p-n homojunction or heterojunction at the top of layer 300. This process regime corresponds to regime including process condition C in FIG. 5. The process parameters for process condition B correspond to:

Argon flow rate into the physical vapor deposition chamber: 190 sccm;
Hydrogen flow rate into the physical vapor deposition chamber: 100 sccm;
Oxygen flow rate into the physical vapor deposition chamber: 40 sccm;
Estimated partial pressure of argon during deposition: 4.75 mTorr;
Estimated partial pressure of hydrogen during deposition: 2.5 mTorr; and
Estimated partial pressure of oxygen during deposition: 1 mTorr.

General process conditions that produce epitaxial CdS layer with strain and having the hexagonal phase upon physical vapor deposition of CdS are believed to include at least the ranges of:

Inert sputter gas (such as Ar) flow rate into the physical vapor deposition chamber: 100 sccm~300 sccm (corresponding to a partial pressure in a range from 2.5 mTorr to 7.5 mTorr);
Hydrogen flow rate into the physical vapor deposition chamber: from 50 sccm to 150 sccm (corresponding to hydrogen partial pressure in a range from 1.25 mTorr to 3.75 mTorr), preferably 80 to 120 sccm (corresponding to hydrogen partial pressure in a range from 2 mTorr to 3 mTorr);
Oxygen flow rate into the physical vapor deposition chamber: from 35 sccm to 60 sccm (corresponding to oxygen partial pressure in a range from 0.875 mTorr to 1.5 mTorr), preferably 30 to 50 sccm (corresponding to oxygen partial pressure in a range from 0.75 mTorr to 1.25 mTorr);
The difference between hydrogen flow rate and oxygen flow rate: from 30 sccm to 80 sccm, (corresponding to the difference between hydrogen partial pressure and oxygen partial pressure in a range from 0.75 mTorr to 2 mTorr), and preferably from 50 sccm to 75 sccm (corresponding to the difference between hydrogen partial pressure and oxygen partial pressure in a range from 1.25 mTorr to 1.875 mTorr), more preferably from 55 sccm to 65 sccm (corresponding to the difference between hydrogen partial pressure and oxygen partial pressure in a range from 1.375 mTorr to 1.625 mTorr); and
Total pressure: from about 5 mTorr to about 10 mTorr (although lesser and greater total pressures can also be employed).

As the hydrogen gas flow and the oxygen gas flow change, the mean open circuit voltage (V_OC) tends to follow a curve having maximum as a function of a parameter defined by the difference between the oxygen gas flow into the process chamber and the hydrogen gas flow into the process chamber, i.e., the oxygen gas flow into the process chamber minus the hydrogen gas flow into the process chamber. This trend is plotted in FIG. 5. The maximum in the mean open circuit voltage (V_OC) has a value of about 0.68 Volt (e.g., between 65 and 68 V), and occurs around processing conditions in which the difference between the oxygen gas flow into the process chamber and the hydrogen gas flow into the process chamber is about −60 sccm. This condition corresponds to a difference in the partial pressure between oxygen and hydrogen of about −1.5 mTorr. In other words, the hydrogen partial pressure is about 1.5 mTorr higher than the oxygen partial pressure.

To form the hexagonal phase copper cadmium sulfide layer 350 and/or the hexagonal phase cadmium sulfide layer 400 (e.g., doped or undoped cadmium sulfide), both oxygen gas and hydrogen gas are preferably present in the physical vapor deposition chamber. In other words, removal of the oxygen gas and the hydrogen gas from the process chamber may not result in the formation of a hexagonal phase layer 350 or 400. The process condition D corresponds to a process regime in which neither hydrogen gas nor oxygen gas is present in the physical vapor deposition chamber. The inferior performance of the solar cell employing the film stack formed by process condition D is manifest in FIG. 5.

Figure 6:
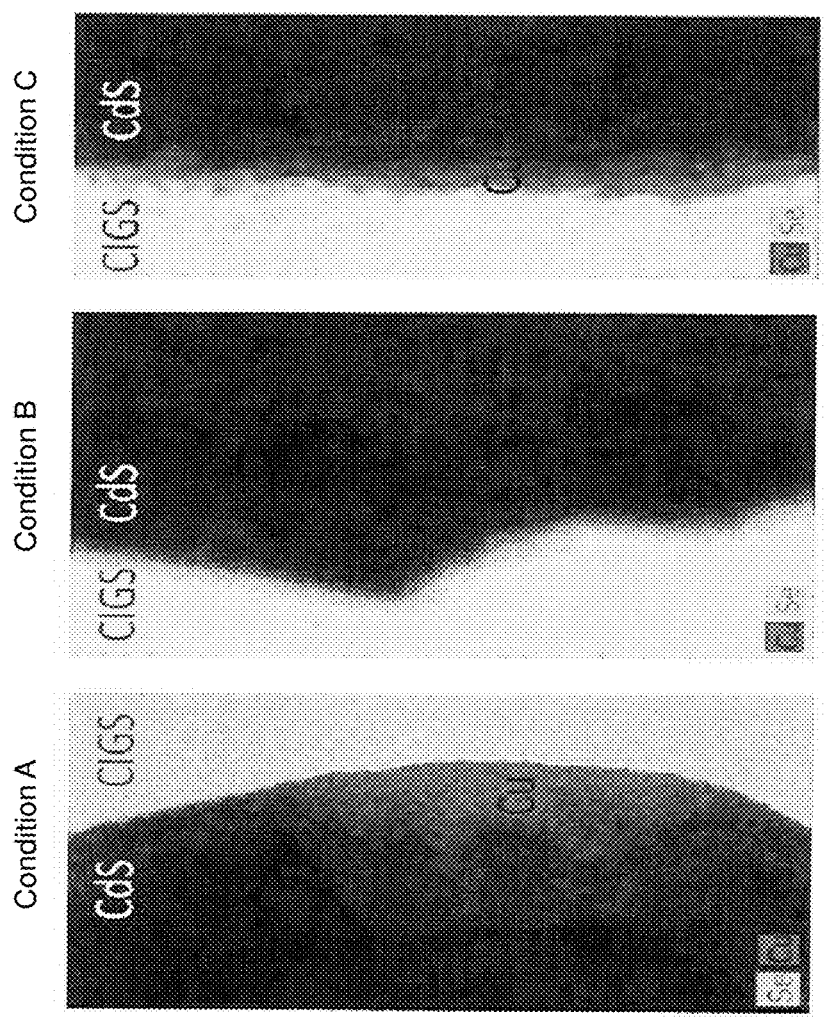
FIG. 6 shows high resolution transmission electron micrographs (HRTEM) of interfacial regions of three samples corresponding to conditions A, B, and C.

Without wishing to be bound by a particular theory, it is believed that the effect of hydrogen gas is more than mere cancellation of the effect of oxygen gas, but includes modification of the crystal structure and crystallographic alignment of the deposited cadmium sulfide material which affects the diffusivity of cadmium and copper at the interface between the CIGS material and the deposited cadmium sulfide material. The underlying mechanism for formation of the hexagonal phase copper cadmium sulfide layer 350 of the present disclosure is due to a balance of hydrogen gas and the oxygen gas. FIG. 6 shows an energy dispersive X-ray spectroscopy (EDS) data from a sample obtained under condition C.

The inventors of the present disclosure observed that, without the influence of diffusing species, addition of hydrogen gas only during the deposition of CdS can increase the carrier mobility in the intrinsic material. Further, addition of the oxygen gas decreases carrier concentration of the intrinsic material. The addition of both hydrogen gas and oxygen gas modulates the carrier concentration more strongly than mobility with the addition of hydrogen gas responding much the way of reduced oxygen. Thus, addition of oxygen gas and hydrogen gas to the magnetron sputtered CdS can impact several changes on the growth of the CdS film and the interaction of the CdS film to the surrounding layers (CIGS below and ZnO above).

The inventors of the present disclosure observed that, in an integrated film stack, the addition of oxygen has a strong effect on the microstructure and crystallography of the resulting CdS film. In general, under hydrogen-dominant residual gas conditions such as condition A, the CdS film is epitaxial and has strong preference for the cubic crystal phase of CdS. With increasing oxygen, the CdS remains epitaxial and can have a variety of cubic and hexagonal crystal phases present. At, or around, a balanced-dual-flow residual gas conditions such as condition C, the CdS film can be epitaxial and can have a predominantly hexagonal crystal phase, while presence of cubic crystal phase in some region can occur as well. As used herein, predominant means more than 50%, such as 75-100%, for example 80-95%. At oxygen-dominant residual gas conditions such as condition B, the CdS film transitions to a nanocrystalline material with no long range crystallographic order.

The type of microstructure and the chemical composition of the composite CdS film can both be used to modulate the impact of migrating species into the CdS. For the case of a CdS deposited with no oxygen gas or hydrogen gas addition (which corresponds to condition D), Cu diffusion from the CIGS to the CdS resulting in a formation of $Cu_2S$ and other undesirable phases). Such process conditions result in a low efficiency solar cell. These results illustrate that, with high oxygen gas flow, there is no Cu diffusion from CIGS to CdS, and with a controlled amount of oxygen flow, the amount of Cu diffusion into the CdS can be limited.

Referring back to FIGS. 1A-1D, a method of manufacturing a photovoltaic structure is provided according to an embodiment of the present disclosure. A p-type semiconductor absorber layer 300 is formed on a first electrode (200 or 100') comprising a metallic material by depositing a copper indium gallium selenide (CIGS) based alloy material. A cadmium sulfide layer 400 composed predominantly of hexagonal phase cadmium sulfide grains is formed over the p-type semiconductor absorber layer 300 under a set of process conditions that induce formation of a hexagonal phase copper cadmium sulfide layer 350 and/or a hexagonal phase cadmium sulfide layer 400 over the p-type semiconductor absorber layer 300. Layer 350 may be formed by replacement of cadmium atoms with copper atoms within an interfacial region of the cadmium sulfide layer 400 in contact with the CIGS absorber layer 300. A second electrode 500 is formed over the cadmium sulfide layer 400.

In one embodiment, the cadmium sulfide layer 400 can be formed by a physical vapor deposition process performed in a process chamber containing an ambient including hydrogen gas and oxygen gas. In one embodiment, partial pressure of the hydrogen gas in the ambient can be greater than partial pressure of the oxygen gas by a range from 1.25 mTorr to 1.75 mTorr. In one embodiment, the ambient can include an inert sputtering gas (such as argon), and total pressure of the ambient can be in a range from 5 mTorr to 10 mTorr. In one embodiment, hydrogen gas is flowed into the process chamber at a first flow rate, oxygen gas is flowed into the process chamber at a second flow rate, and the difference between the first flow rate and the second flow rate is in a range from 50 sccm to 70 sccm.

As used herein, a growth direction refers to the direction along which a deposited material accumulates, and is typically perpendicular to plane of the surface upon which the deposited material accumulates.

In one embodiment, a predominant portion of the hexagonal phase cadmium sulfide grains in the cadmium sulfide layer 400 can be in epitaxial alignment with a respective crystalline grain of the hexagonal phase copper cadmium sulfide layer 350. As used herein, a "predominant portion" of an element refers to a subset that includes at least 50% of all atoms of the element. In one embodiment, a predominant portion of the crystalline grains of the hexagonal phase copper cadmium sulfide layer 350 can be formed with epitaxial alignment with a respective crystalline grain of the p-type semiconductor absorber layer 300. In one embodiment, the crystalline grains of the hexagonal phase copper cadmium sulfide layer 350 can have an average grain size greater than 10 nanometers, and the crystalline grains of the p-type semiconductor absorber layer 300 can have an average grain size greater than 10 nanometers.

In one embodiment, the hexagonal phase copper cadmium sulfide layer 350 can be at least partially formed during deposition of the cadmium sulfide layer 400. Optionally, additional diffusion from the CIGS based material from the p-type semiconductor absorber layer 300 while the photovoltaic structure is at an elevated temperature (prior to cool down to room temperature) can increase the thickness of the hexagonal phase copper cadmium sulfide layer 350.

In one embodiment, the hexagonal phase copper cadmium sulfide layer 350 can comprise hexagonal phase grains that are in contact with, and in epitaxial alignment with, a respective crystalline grain of the p-type semiconductor absorber layer 300. In one embodiment, the hexagonal phase copper cadmium sulfide layer 350 can have a composition of $Cu_xCd_{1-x}S$, wherein x is in a range from 0.01 to 0.3. In one embodiment, the hexagonal phase copper cadmium sulfide layer 350 can have a thickness in a range from 1 nm to 10 nm, and the cadmium sulfide layer 400 can have a thickness in a range from 20 nm to 60 nm.

Each of the structures of FIGS. 1C and 1D includes a photovoltaic structure. As used herein, a "photovoltaic structure" refers to a structure that generates photovoltaic voltage upon irradiation with electromagnetic radiation in a suitable wavelength range (such as visible range (400 nm-800 nm), infrared range, and ultraviolet range). Photovoltaic structures include, but are not limited to, solar cells.

Each of the photovoltaic structure in FIGS. 1C and 1D includes a first electrode (200 or 100') comprising a metallic material, and a p-type semiconductor absorber layer 300 located over the first electrode (200 or 100'). The p-type semiconductor absorber layer 300 includes a copper indium gallium selenide (CIGS) based alloy material. Each of the photovoltaic structure in FIGS. 1C and 1D further includes a hexagonal phase copper cadmium sulfide layer 350 on the p-type semiconductor absorber layer; a cadmium sulfide layer 400 composted predominantly of hexagonal phase cadmium sulfide grains: and a second electrode 500 located over the cadmium sulfide layer 400.

In summary, without wishing to be bound by a particular theory, it is believed that addition of both hydrogen and oxygen containing gases during sputtering of the buffer cadmium sulfide layer 400 improves the properties of the solar cell, such as carrier mobility and open circuit voltage. In some embodiments, the copper cadmium sulfide layer 350 is present. In other embodiments (e.g., for higher oxygen flow rates), this layer 350 may not be present. While layers 350 and/or 400 preferably have a single crystal hexagonal structure, they may have any other suitable structure, such as cubic, a combination of cubic and hexagonal, or nanocrystalline. These layers may also contain lateral non-uniformities in composition and/or orientation. The cadmium sulfide layer 400 may be undoped or doped with one or more of copper, zinc (e.g., diffused from the second electrode 500), oxygen (e.g., diffused from the second electrode 500 or from the sputtering ambient), and/or hydrogen (e.g., from the sputtering ambient). Furthermore, other oxidizing and reducing gases may be used in addition to or instead of pure oxygen and pure hydrogen gases (e.g., water vapor).

Without wishing to be bound by a particular theory, it is believed that lower oxygen flow during sputtering may cause copper to diffuse from layer 300 into cadmium sulfide layer 400 and cause epitaxial growth. Higher oxygen flow in the absence of hydrogen flow may cause zinc to diffuse from the second electrode 500 into the buffer cadmium sulfide layer 400. Cadmium may diffuse from cadmium sulfide layer 400 into the CIGS layer 300 for moderate or low oxygen flow.

Without wishing to be bound by a particular theory, it is believed that if a relatively small amount of cadmium (e.g., much less than 1 atomic percent) diffuses into the top of the CIGS absorber layer 300, then it may dope the upper portion of the CIGS layer 300 n-type and thereby create a p-n homojunction 380 between the lower portion 370 of the p-type CIGS absorber 300 and the n-type, cadmium doped CIGS upper portion 375 of layer 300, as shown in FIG. 1C. Alternatively, if a larger amount of cadmium e.g., about 1 atomic percent or greater diffuses into layer 300, then a p-n heterojunction 380 is formed between the lower portion 370 of the p-type CIGS (e.g., $Cu(In,Ga)Se_2$) absorber 300 and the n-type, cadmium copper indium gallium selenide (e.g., $CdCu(In,Ga)Se_3$) upper portion 375 of layer 300. If the junction 380 between portions 370 and 375 is inside the CIGS layer 300, then the electrons are majority carriers by the time that they reach the buffer cadmium sulfide layer 400 (or the intermediate layer 350), where a very high density of recombination defects is expected. This would be expected to improve the solar cell efficiency because these recombination defects would not be in the depletion region where the density of holes is higher, allowing the electrons to recombine more easily at the defects.

In an ideal case, the cadmium copper indium gallium selenide (e.g., $CdCu(In,Ga)Se_3$) upper portion 375, i.e., copper-doped CIGS portions, can be located between the entire interface of the lower p-type CIGS portion 370 of the absorber layer 300 and the overlying n-type layer (e.g., buffer cadmium sulfide layer 400 or intermediate layer 350). However, there may be non-uniformities in a non-ideal case where the lower p-type CIGS portion 370 directly contacts the n-type buffer cadmium sulfide layer 400 and/or intermediate layer 350.

Without wishing to be bound by a particular theory, it is also believed that if a sufficiently large amount of cupper migrates from absorber layer 300 into the buffer cadmium sulfide layer 400, then it is also possible to create a p-type region (e.g., copper sulfide) in the lower portion of the buffer cadmium sulfide layer 400, thus creating a p-n heterojunction with the n-type portion 375 of layer 300. This way, this junction will be opposing the buried p-n junction 380 in layer 300.

EXAMPLES

By using advanced scanning transmission electron microscopy (STEM) combined with energy dispersive X-ray spectroscopy (EDS), the inventors investigated systematically several different PVD-CdS/CIGS heterojunctions made by magnetron sputtering on a moving substrate while both hydrogen and oxygen were introduced into the process chamber, as described above. The major difference of the heterojunctions being a different oxygen content employed in the sputtering gas during the PVD cadmium sulfide deposition process.

Table I shows the measured performance of four different CdS/CIGS devices with different $O_2$ concentration in the CdS process. The G19 (with highest $O_2$) delivers the lowest efficiency while the G21 (with no $O_2$) exhibits better performance. With the increase of $O_2$ in the CdS, the device performance gradually improved as seen in the G20 and G25 devices before decreasing at the highest levels. This implies that modest incorporation of O in CdS is beneficial for further optimizing the device performance.

TABLE I

Device parameters measured from four different CdS/CIGS solar cells with different O concentrations in the CdS process.

| Sample | Efficiency (%) | Jsc (mA/cm$^2$) | FF | Voc (mV) |
| --- | --- | --- | --- | --- |
| G19(40 sccm of $O_2$, No $H_2$) | 9.04 | 30.37 | 0.49 | 610 |
| G20(No $O_2$, 100 sccm $H_2$) | 13.39 | 31.08 | 0.73 | 580 |
| G25(40 sccm $O_2$, 100 sccm $H_2$) | 15.86 | 31.81 | 0.74 | 670 |
| G21(No $O_2$, No $H_2$) | 11.49 | 30.08 | 0.70 | 540 |

EXPERIMENT

Samples studied here were all processed in production equipment using process settings described above. All layers the samples were deposited sequentially onto flexible stainless steel substrates in a single pass all-PVD process system with no vacuum break.

All the transmission electron microscopy (TEM) samples were prepared by a lift-out method on a FEI Helios Nanolab 600i focused ion beam (FIB) instrument. To reduce the Ga ion surface damage and implantation, a small current and voltage (8 pA, 1 kV) was used for final cleaning. Finally, immediately before analysis, all the TEM samples were cleaned using a Fischione's Model 1040 NanoMill specimen preparation system to further minimize the Ga-induced amorphous layer and damage. To protect the fresh samples from being oxidized gradually in air, the samples were stored in a special TEM sample preservation capsule that could be evacuated and back filled with dry nitrogen. The STEM-EDS maps were acquired in a Titan-X chemi-STEM microscope (National Center for Electron Microscopy, Lawrence Berkeley National Lab), which is equipped with a Super-X detector enabling elemental mapping with high signal/noise ratio, typically in several minutes. The K lines of all the elements are utilized for EDS maps and quantification. Before acquiring EDS maps, the heterojunctions were oriented to a CIGS [021] zone axis where clear high resolution TEM images of the hetero-interface can be recorded without any indication of overlap between CIGS grains and CdS layers to ensure the interface is parallel to the electron beam. After acquiring the EDS maps, the area of interest was carefully examined in HREM image mode to make sure that EDS maps came exactly from where HREM images were recorded.

Results and Discussion

A typical STEM-EDS map from sample G21 is shown in FIGS. 7a-7d, where the most notable feature is the deeply depleted Cd region in the CdS (dark region in FIG. 7a, denoted by a circle) filled by a high concentration of Cu (FIG. 7b). From FIG. 7d it is shown that no significant Zn doping of the CdS from the ZnO is observed, which is different from some other samples as discussed below. Quantitative EDS analysis reveals its composition: Cu 65.77%, Cd 0.59%, S 33.64%, which is very close to $Cu_2S$, although the inventors are unable to distinguish this composition from other phases such as $Cu_{1.9}S$ without improved calibration standards.

Figure 8:
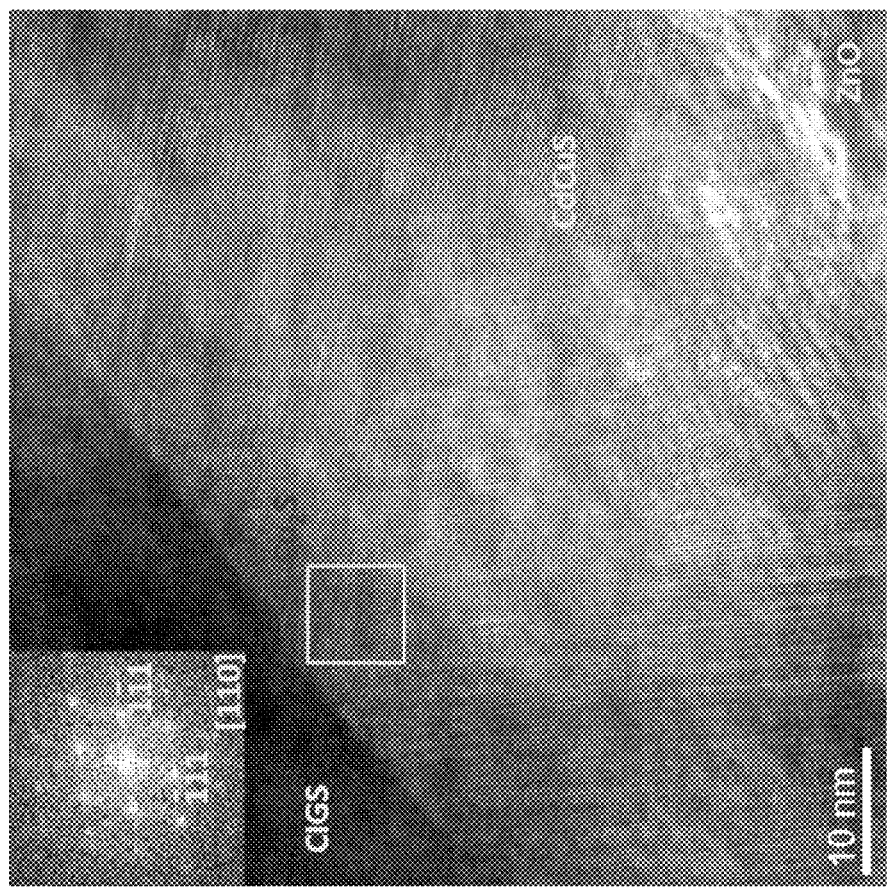
FIG. 8 shows HRTEM image taken from where highly Cd depletion region (white circle in FIG. 7A) occurs. The hetero-interface is rather coherent. Top left inset shows a FFT pattern, which can be well indexed to be cubic $Cu_2S$ [110] zone axis, of highly Cd depletion region indicated by the square.

A high resolution TEM (HRTEM) image recorded in this $Cu_2S$ region is shown in FIG. 8. FIG. 8 demonstrates that the hexagonal phase copper cadmium sulfide layer 350 and/or hexagonal phase cadmium sulfide layer 400 are present under condition C. Such hexagonal phases were not observed from samples formed under condition A or under condition B. The hetero-interface is coherent with clear lattice fringes present on both sides of the interface. The square indicated by the yellow solid line in FIG. 8 corresponds to the circled region in the Cd map in FIG. 7a. From a fast Fourier transform (FFT) of the image, shown in the inset, the structure can be determined and is described well by cubic $Cu_2S$ with lattice parameters consistent with the $Cu_2S$ powder diffraction file card number 00-053-0522 (5.56 Å). Thus, the inventors conclude that the heterojunction partner material in some portions of the heterojunction is $Cu_2S$, epitaxially grown on the CIGS with the same orientational relationship as for cubic CdS on CIGS. $Cu_2S$ is a known semiconductor with a band gap of about 1.15 eV. It is typically p-type. $Cu_2S$ has been previously used in CdS—$Cu_2S$ solar cells. Thus, it has a comparable band gap to CIGS and can potentially form its own collecting heterojunction with the CdS surrounding it. As with CdS, $Cu_2S$ contains a large number of defects and thus is not expected to yield photocurrent from the $Cu_2S$ itself.

In addition, there is appreciable Cd intensity about 10 nm into the CIGS (FIG. 7a). For example, the composition of the CIGS (indicated by the rectangle in FIG. 7a) was determined to be: Cu 22.61%, Cd 1.28%, In 14.65%, Ga 10.77% and Se 50.75%, which indicates a Cu deficient CIGS surface layer doped by Cd. The doped layer penetrates quite far into the CIGS and should result in n-type material there. This would lead to the formation of a buried p-n homojunction in CIGS.

Recent theoretical calculations carried out by Varley et al. (J. B. Varley and V. Lordi, Appl Phys Lett 103 (10) (2013), and J. B. Varley and V. Lordi, J Appl Phys 116 (6) (2014)), show that the Cd vacancies (VCd-2) are the most energetically stable native defect in n-type CdS and can be coulombically attracted to Cui+ and can react, forming CuCd–. This singly-charged defect would effectively liberate an electron when Cu occupies a Cd vacancy, potentially increasing the n-type doping. More n-type doping would encourage more VCd-2 formation and hence more Cu filling those vacancies. This would result in driving of Cu into the CdS. Moreover, the fading intensity of Cu along with the increasing intensity of Cd towards the outer portion of the CdS suggests that Cd ions and Cu ions may go through a cation exchange process. This could explain why Cd can go further into the CIGS (35 nm) based on a high concentration of Cu vacancies near the CIGS surface region. From FIG. 7d it is shown that no significant Zn doping into CdS is observed, which is different from the other sample with some amounts of O in CdS where the inventors observe some Zn doping in CdS.

Stoichiometric CdS has a direct band gap of about 2.4 eV, which causes the absorption of light at wavelengths below ~550 nm and reduces the quantum efficiency in the blue spectral region. It has been reported by Wu et al., (X. Wu, et al., *High-efficiency polycrystalline CdTe thin-film solar cells with an oxygenated amorphous CdS (a-CdS:O) window layer*. Proceedings of the 29th IEEE PV Specialists Conference New Orleans, La. May 20-24, 2002, pp. 531), that incorporation of O into CdS by a sputtering process can increase the band gap and reduce the crystallinity of CdS. They demonstrated a much improved $J_{sc}$ in CdS/CdTe solar cells while maintaining a higher $V_{oc}$ and fill factor by incorporation of O in CdS. However, G19 (see Table I) shows the lowest efficiency among the three samples. Thus there is an upper limit to acceptable levels of $O_2$ in the process gas.

Figure 9:
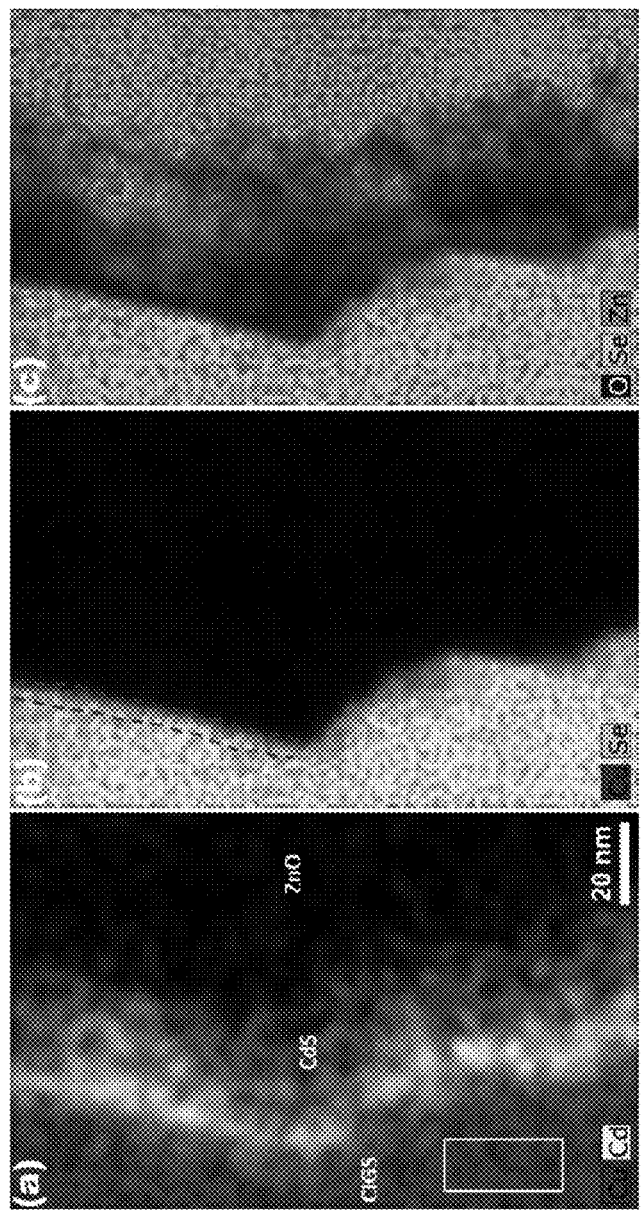
FIGS. 9A-9C show STEM-EDS maps of CdS/CIGS heterojunction in exemplary device G19 (high O doping in CdS).

FIG. 9 displays the typical EDS maps from G19. No apparent Cu (FIG. 9b) is found in the CdS in this sample, suggesting that incorporation of high concentrations of $O_2$ can prevent Cu from migrating into CdS. This phenomenon is similar to a previous observation in the above mentioned Wu et al. article that oxygenated CdS can inhibit Te diffusion from CdTe into CdS. A closer examination reveals that there is a Se and Ga rich layer at the CIGS surface (denoted by two dashed red lines in FIG. 9b) and filled by some Cd (FIG. 3a). This indicates that this sample includes a Cu deficient CIGS surface doped by Cd ions. It has been shown by Liao et al., (D. X. Liao and A. Rockett, Appl Phys Lett 82 (17), 2829 (2003) and D. X. Liao and A. Rockett, J Appl Phys 93 (11), 9380 (2003)) that the presence of a Cu depleted CIGS surface, which could further facilitate the Cd doping of the CIGS surface. It was proposed that this was due to the surface reconstruction of the cation-terminated (112) polar surface, which has a low energy in CIGS. It was suggested that the absence of Cu would reduce the electric dipole energy before CdS deposition, as supported by density functional theory calculations of Zhang et al. (S. B. Zhang and S. H. Wei, Phys Rev B 65 (8) (2002)). It was further suggested based on experimental results that Cd replaces the missing Cu in the outer monolayer. EDS quantification from the white rectangular box in FIG. 9a gives a composition of CIGS: Cu 24.13%, Cd 0%, Ga 11.75%, In 14.19%, Se 49.93%, which is very close to stoichiometric $CuInGaSe_2$. The absence of Cd in CIGS close to the heterojunction suggests no apparent formation of a p-n homojunction further into CIGS in G19.

Figure 10:
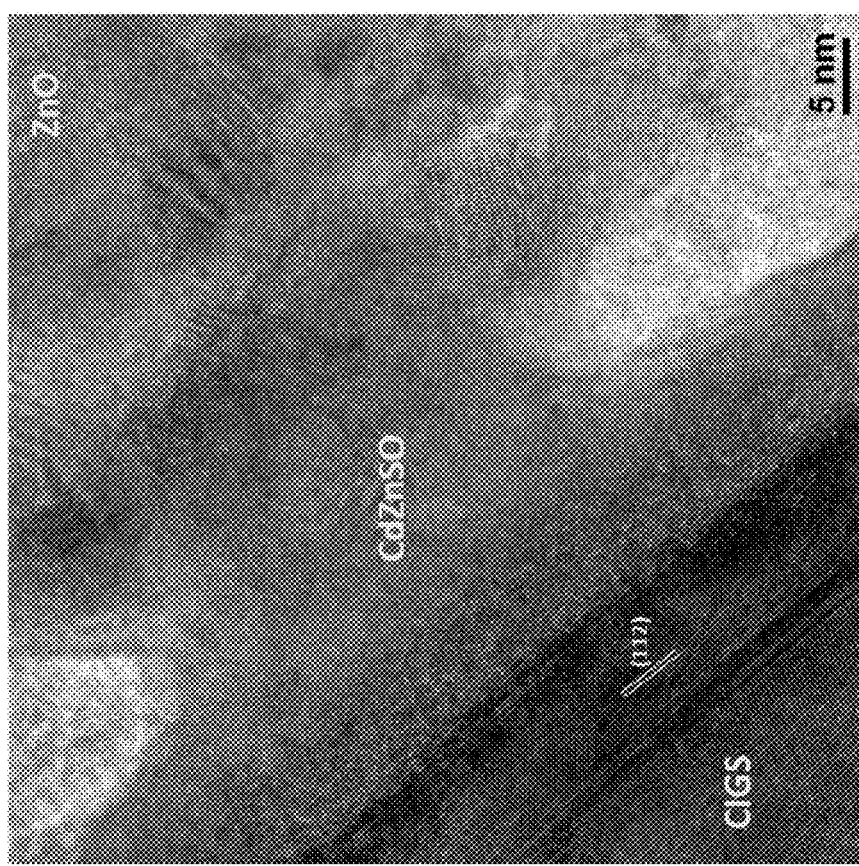
FIG. 10 is a HRTEM image taken from where STEM-EDS maps in FIG. 9 are recorded, showing nanocrystallinity of the quaternary compound CdZnSO. High concentration oxygen doping in CdS degrades epitaxy and crystallinity of the buffer layer.

An additional striking difference for this sample is that Zn and O are distributed throughout the CdS layer. The quaternary (Cd,Zn)(O,S) alloy is supposed to possess a larger band gap compared to CdS and could allow more light in the blue spectral region to be absorbed in the CIGS, thus improving the quantum efficiency. HRTEM images (FIG. 10) taken from where EDS maps was recorded show that the (Cd,Zn)(O,S) buffer layer is nanocrystalline. It is expected that with further increases of $O_2$ the oxygenated CdS would become completely amorphous.

Figure 11:
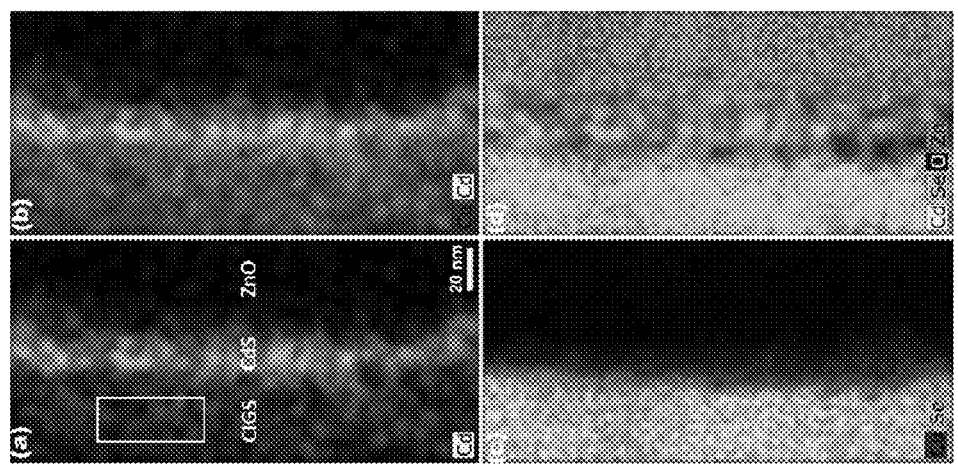
FIG. 11 is acquired. Hexagonal $Cd_xCu_{1-x}S$ phase of high crystallinity is grown epitaxially on CIGS. The epitaxial relationship can be observed.

FIG. 11 displays the STEM-EDS maps taken from the process of record sample, G25. There is a strong Cd signal measurable at least 30 nm into the CIGS grains in FIG. 11a. The composition of the region denoted by the rectangular box in FIG. 11a was determined to be: Cu 23.72%, Cd 6.97%, In 13.11%, Ga 9.58% and Se 46.64%. In this region, no apparent Cu depletion is observed. Apparently the Cd concentration in the CIGS is much higher than in G21. The lower Cd concentration in Sample G21 also shows that the Cd observed in G25 is probably not an instrument artifact. The inventors note that the composition given above is very cation-rich, which would imply a large density of Se vacancies (donors). The high concentration of Cd in the CIGS may also lead to a stable compound. The EDS composition given above could be interpreted as a mixture of ~40% $CuCd(In,Ga)Se_3$ and ~60% $Cu(In,Ga)Se_2$ but the resulting mixture is still anion deficient. In addition, the inventors find some heterojunctions with Cu deficient CIGS but with a higher Cd concentration than in G21 (not shown). Similar to the case of G21, a p-n homojunction, but with higher strength due to higher concentration of Cd doping, is formed. In both cases above, a much stronger p-n junction related to higher concentration of Cd doping in CIGS surface are generated. For sample G25, Zn and O is found in the outer part of the CdS, which is beneficial for harvesting of short wavelength in CIGS absorber. The mixing is not as extreme as in sample G19, where Zn and O are found throughout the CdS but significantly greater than in G21 where essentially no Zn or O are found in the CdS.

Figure 12:
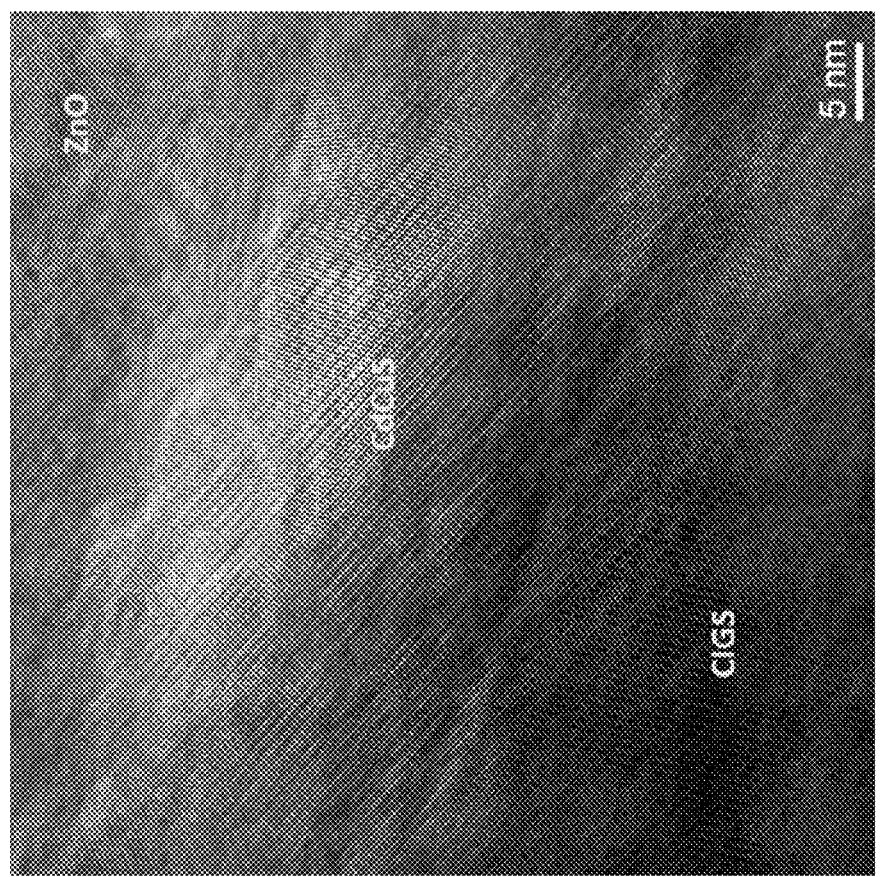
FIG. 12 shows a HRTEM image taken from the region where

A typical HRTEM image of a wurtzite region of CdS epitaxially grown on a CIGS grain from Sample G25 is shown in FIG. 12. The hetero-interface is very coherent and no obvious lattice defects can be seen. The lattice match in this case appears to be very close based on the lattice fringe spacings. The high crystallinity and epitaxy of the CdS buffer on the CIGS surface indicates that collection of photo-generated carriers in CdS buffer may be possible and may provide more flexibility in buffer layer engineering.

FIGS. 13A-13B show STEM-EDS maps of CdS/CIGS heterojunction in exemplary devices G09 and G02 (medium O doping in CdS). The G09 device had a higher hydrogen to oxygen flow ratio ($O_2$—$H_2$ flow difference of negative 70 sccm) during CdS deposition than the G02 device ($O_2$—$H_2$ flow difference of negative 50 sccm). A single crystal hexagonal CdS layer with atomic terraces is observed in the G09 device in FIG. 13A, while nanocrystalline CdS is observed in the G02 device in FIG. 13B.

Thus, CIGS/CdS type solar cells of the preferred embodiments of the present disclosure have a high open circuit voltage (e.g., at least 650 mV, such as 650 to 670 mV) and a high efficiency of at least 15%, such as 15 to 15.85%.

The inventors showed that elemental intermixing of PVD-CdS/CIGS heterojunctions and epitaxy of CdS buffer layer can be tuned by means of different oxygen concentrations employed in the PVD process gas in which CdS is deposited. More O inhibits Cu migration into the CIGS but facilitates Zn movement into the CdS, resulting in a quaternary CdZnOS buffer layer. Meanwhile, less O enhances crystallinity and epitaxy of CdS. In G25 (modest O doping, highest efficiency), an apparent CIGS surface layer with the highest Cd doping concentration is identified. Our results indicate that high crystallinity and epitaxy of PVD-CdS on CIGS and the formation of a relatively deep buried p-n homojunction in the CIGS could explain why the PVD-CdS/CIGS solar cell device here can be as successful as its counterpart CBD-CdS/CIGS.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of manufacturing a photovoltaic structure, comprising:
    forming a p-type semiconductor absorber layer comprising a copper indium gallium selenide based material over a first electrode;
    forming a single crystal n-type cadmium sulfide layer having a predominant hexagonal crystal structure over the p-type semiconductor absorber layer by sputtering in an ambient including hydrogen gas and oxygen gas, the ambient having a partial pressure of the hydrogen gas that is greater than a partial pressure of the oxygen gas by 1.25 mTorr to 1.875 mTorr, wherein during the sputtering cadmium atoms from the n-type cadmium sulfide layer diffuse into an upper portion of the p-type semiconductor absorber layer to form a n-type cadmium doped copper indium gallium selenide semiconductor upper portion of the semiconductor absorber layer and thereby create a p-n junction between a p-type copper indium gallium selenide semiconductor lower portion of the absorber layer and the n-type cadmium doped copper indium gallium selenide semiconductor upper portion of the absorber layer; and
    forming a second electrode over the cadmium sulfide layer,
    wherein the ambient consists essentially of an inert sputter gas having a partial pressure in a range from 2.5 mTorr to 7.5 mTorr; the hydrogen gas having a partial pressure in a range from 1.25 mTorr to 3.75 mTorr; and the oxygen gas having a partial pressure in a range from 0.875 mTorr to 1.5 mTorr; and
    wherein the step of forming the n-type cadmium sulfide layer by sputtering comprises sputtering the n-type cadmium sulfide layer from a CdS target in the ambient.

2. The method of claim 1, wherein:
    the ambient includes an inert sputtering gas; and
    a total pressure of the ambient is in a range from 5 mTorr to 10 mTorr.

3. The method of claim 1, wherein:
    hydrogen gas is flowed into a sputtering chamber at a first flow rate;
    oxygen gas is flowed into the sputtering chamber at a second flow rate; and
    a difference between the first flow rate and the second flow rate is in a range from 30 sccm to 80 sccm.

4. The method of claim 1, wherein forming the n-type cadmium sulfide layer comprises forming a single crystal intrinsically doped or zinc doped cadmium sulfide layer having the predominant hexagonal crystal structure by the sputtering in the ambient.

5. The method of claim 1, wherein forming the n-type cadmium sulfide layer comprises forming a single crystal copper cadmium sulfide layer having the predominant hexagonal crystal structure by the sputtering in the ambient.

6. The method of claim 5, wherein the single crystal copper cadmium sulfide layer is composed predominantly of one or more hexagonal phase cadmium sulfide grains.

7. The method of claim 1, wherein forming the n-type cadmium sulfide layer comprises forming a first single crystal copper cadmium sulfide layer having the predominant hexagonal crystal structure by the sputtering in the ambient and forming a second single crystal cadmium sulfide layer having the predominant hexagonal crystal structure over the first single crystal copper cadmium sulfide layer by the sputtering in the ambient.

8. The method of claim 1, wherein forming the second electrode comprises forming a zinc containing oxide layer such that zinc diffuses into the n-type cadmium sulfide layer to form a zinc doped cadmium sulfide layer.

9. The method of claim 8, wherein oxygen and the zinc diffuse into the n-type cadmium sulfide layer to form a zinc and oxygen doped cadmium sulfide layer.

10. The method of claim 1, wherein the n-type cadmium sulfide layer is doped with one or more of copper, zinc, oxygen or hydrogen.

11. The method of claim 1, wherein the p-n junction is a homojunction.

12. The method of claim 1, wherein the p-n junction is a p-n heterojunction.

* * * * *